United States Patent
Ye et al.

(10) Patent No.: US 9,300,206 B2
(45) Date of Patent: Mar. 29, 2016

(54) METHOD FOR ESTIMATING POWER OF A POWER CONVERTER

(71) Applicant: Power Systems Technologies, Ltd., Ebene (MU)

(72) Inventors: Zhen Z. Ye, Garland, TX (US); Jamie L. Dunn, Allen, TX (US)

(73) Assignee: Power Systems Technologies Ltd., Ebene (MU)

( * ) Notice: Subject to any disclaimer, the term of this patent is extended or adjusted under 35 U.S.C. 154(b) by 309 days.

(21) Appl. No.: 14/080,992

(22) Filed: Nov. 15, 2013

(65) Prior Publication Data

US 2015/0138857 A1     May 21, 2015

(51) Int. Cl.
| | |
|---|---|
| H02M 3/157 | (2006.01) |
| H02M 1/42 | (2007.01) |
| G01R 31/40 | (2014.01) |
| G01R 21/06 | (2006.01) |

(52) U.S. Cl.
CPC ............ *H02M 3/157* (2013.01); *H02M 1/4225* (2013.01); *G01R 21/06* (2013.01); *G01R 31/40* (2013.01)

(58) Field of Classification Search
CPC ............................ H02M 1/4225; H02M 7/217
See application file for complete search history.

(56) References Cited

U.S. PATENT DOCUMENTS

| | | | |
|---|---|---|---|
| 1,376,978 A | 5/1921 | Stoekle | |
| 2,387,943 A | 10/1945 | Putman | |
| 2,473,662 A | 6/1949 | Pohm | |
| 3,007,060 A | 10/1961 | Guenther | |
| 3,346,798 A | 10/1967 | Dinger | |
| 3,358,210 A | 12/1967 | Grossoehme | |
| 3,433,998 A | 3/1969 | Woelber | |
| 3,484,562 A | 12/1969 | Kronfeld | |
| 3,553,620 A | 1/1971 | Cielo et al. | |
| 3,622,868 A | 11/1971 | Todt | |
| 3,681,679 A | 8/1972 | Chung | |

(Continued)

FOREIGN PATENT DOCUMENTS

| | | |
|---|---|---|
| CN | 101202509 | 8/1995 |
| CN | 1180955 A | 5/1998 |

(Continued)

OTHER PUBLICATIONS

Ridley, R., Designing with the TL431, Switching Power Magazine, Designer Series XV, pp. 1-5, 2005.

(Continued)

*Primary Examiner* — Timothy J Dole
*Assistant Examiner* — Yusef Ahmed
(74) *Attorney, Agent, or Firm* — Boisbrun Hofman, PLLC

(57) ABSTRACT

A controller for estimating a power of a power converter and method of estimating the same has been introduced herein. In one embodiment, the controller includes an analog/digital converter configured to provide samples of a rectified voltage waveform corresponding to a rectified sensed voltage of the power converter. The controller also includes a processor configured to estimate a minimum value of the rectified voltage waveform in accordance with the samples and remove an offset from the rectified voltage waveform to obtain an unbiased rectified voltage waveform in accordance with the estimate of the minimum value. The controller is also configured to obtain an unbiased rectified current waveform corresponding to sensed current of the power converter and provide an average power of the power converter.

20 Claims, 7 Drawing Sheets

(56) References Cited

U.S. PATENT DOCUMENTS

| | | |
|---|---|---|
| 3,708,742 A | 1/1973 | Gunn |
| 4,011,498 A | 3/1977 | Hamsra |
| 4,019,122 A | 4/1977 | Ryan |
| 4,075,547 A | 2/1978 | Wroblewski |
| 4,202,031 A | 5/1980 | Hesler et al. |
| 4,257,087 A | 3/1981 | Cuk |
| 4,274,071 A | 6/1981 | Pfarre |
| 4,327,348 A | 4/1982 | Hirayama |
| 4,471,423 A | 9/1984 | Hase |
| 4,499,481 A | 2/1985 | Greene |
| 4,570,174 A | 2/1986 | Huang et al. |
| 4,577,268 A | 3/1986 | Easter et al. |
| 4,581,691 A | 4/1986 | Hock |
| 4,613,841 A | 9/1986 | Roberts |
| 4,636,823 A | 1/1987 | Margalit et al. |
| 4,660,136 A | 4/1987 | Montorefano |
| 4,672,245 A | 6/1987 | Majumdar et al. |
| 4,770,667 A | 9/1988 | Evans |
| 4,770,668 A | 9/1988 | Skoultchi et al. |
| 4,780,653 A | 10/1988 | Bezos et al. |
| 4,785,387 A | 11/1988 | Lee et al. |
| 4,799,138 A | 1/1989 | Chahabadi et al. |
| 4,837,496 A | 6/1989 | Erdi |
| 4,866,367 A | 9/1989 | Ridley et al. |
| 4,876,638 A | 10/1989 | Silva et al. |
| 4,887,061 A | 12/1989 | Matsumura |
| 4,899,271 A | 2/1990 | Seiersen |
| 4,903,089 A | 2/1990 | Hollis et al. |
| 4,922,400 A | 5/1990 | Cook |
| 4,962,354 A | 10/1990 | Visser et al. |
| 4,964,028 A | 10/1990 | Spataro |
| 4,999,759 A | 3/1991 | Cavagnolo et al. |
| 5,003,277 A | 3/1991 | Sokai et al. |
| 5,014,178 A | 5/1991 | Balaakrishnan |
| 5,027,264 A | 6/1991 | DeDoncker et al. |
| 5,055,991 A | 10/1991 | Carroll |
| 5,068,756 A | 11/1991 | Morris et al. |
| 5,106,778 A | 4/1992 | Hollis et al. |
| 5,126,714 A | 6/1992 | Johnson |
| 5,132,888 A | 7/1992 | Lo et al. |
| 5,134,771 A | 8/1992 | Lee et al. |
| 5,172,309 A | 12/1992 | DeDoncker et al. |
| 5,177,460 A | 1/1993 | Dhyanchand et al. |
| 5,182,535 A | 1/1993 | Dhyanchand |
| 5,204,809 A | 4/1993 | Andresen |
| 5,206,621 A | 4/1993 | Yerman |
| 5,208,739 A | 5/1993 | Sturgeon |
| 5,223,449 A | 6/1993 | Morris et al. |
| 5,225,971 A | 7/1993 | Spreen |
| 5,231,037 A | 7/1993 | Yuan et al. |
| 5,244,829 A | 9/1993 | Kim |
| 5,262,930 A | 11/1993 | Hua et al. |
| 5,291,382 A | 3/1994 | Cohen |
| 5,303,138 A | 4/1994 | Rozman |
| 5,305,191 A | 4/1994 | Loftus et al. |
| 5,335,163 A | 8/1994 | Seiersen |
| 5,336,985 A | 8/1994 | McKenzie |
| 5,342,795 A | 8/1994 | Yuan et al. |
| 5,343,140 A | 8/1994 | Gegner |
| 5,353,001 A | 10/1994 | Meinel et al. |
| 5,369,042 A | 11/1994 | Morris et al. |
| 5,374,887 A | 12/1994 | Drobnik |
| 5,399,968 A | 3/1995 | Sheppard et al. |
| 5,404,082 A | 4/1995 | Hernandez et al. |
| 5,407,842 A | 4/1995 | Morris et al. |
| 5,453,923 A | 9/1995 | Scalais et al. |
| 5,459,652 A | 10/1995 | Faulk |
| 5,468,661 A | 11/1995 | Yuan et al. |
| 5,477,175 A | 12/1995 | Tisinger et al. |
| 5,508,903 A | 4/1996 | Alexndrov |
| 5,523,673 A | 6/1996 | Ratliff et al. |
| 5,539,630 A | 7/1996 | Pietkiewicz et al. |
| 5,554,561 A | 9/1996 | Plumton |
| 5,555,494 A | 9/1996 | Morris |
| 5,581,224 A | 12/1996 | Yamaguchi |
| 5,610,085 A | 3/1997 | Yuan et al. |
| 5,624,860 A | 4/1997 | Plumton et al. |
| 5,636,116 A | 6/1997 | Milavec et al. |
| 5,661,642 A | 8/1997 | Shimashita |
| 5,663,876 A | 9/1997 | Newton et al. |
| 5,671,131 A | 9/1997 | Brown |
| 5,700,703 A | 12/1997 | Huang et al. |
| 5,712,189 A | 1/1998 | Plumton et al. |
| 5,719,544 A | 2/1998 | Vinciarelli et al. |
| 5,734,564 A | 3/1998 | Brkovic |
| 5,736,842 A | 4/1998 | Jovanovic |
| 5,742,491 A | 4/1998 | Bowman et al. |
| 5,747,842 A | 5/1998 | Plumton |
| 5,756,375 A | 5/1998 | Celii et al. |
| 5,760,671 A | 6/1998 | Lahr et al. |
| 5,783,984 A | 7/1998 | Keuneke |
| 5,784,266 A | 7/1998 | Chen |
| 5,804,943 A | 9/1998 | Kollman et al. |
| 5,815,386 A | 9/1998 | Gordon |
| 5,864,110 A | 1/1999 | Moriguchi et al. |
| 5,870,296 A | 2/1999 | Schaffer |
| 5,870,299 A | 2/1999 | Rozman |
| 5,886,508 A | 3/1999 | Jutras |
| 5,889,298 A | 3/1999 | Plumton et al. |
| 5,889,660 A | 3/1999 | Taranowski et al. |
| 5,900,822 A | 5/1999 | Sand et al. |
| 5,905,369 A | 5/1999 | Ishii et al. |
| 5,907,231 A | 5/1999 | Watanabe et al. |
| 5,907,481 A | 5/1999 | Svardsjo |
| 5,909,110 A | 6/1999 | Yuan et al. |
| 5,910,665 A | 6/1999 | Plumton et al. |
| 5,920,475 A | 7/1999 | Boylan et al. |
| 5,925,088 A | 7/1999 | Nasu |
| 5,929,665 A | 7/1999 | Ichikawa et al. |
| 5,933,338 A | 8/1999 | Wallace |
| 5,940,287 A | 8/1999 | Brkovic |
| 5,946,207 A | 8/1999 | Schoofs |
| 5,956,245 A | 9/1999 | Rozman |
| 5,956,578 A | 9/1999 | Weitzel et al. |
| 5,959,850 A | 9/1999 | Lim |
| 5,977,853 A | 11/1999 | Ooi et al. |
| 5,982,640 A | 11/1999 | Naveed |
| 5,999,066 A | 12/1999 | Saito et al. |
| 5,999,429 A | 12/1999 | Brown |
| 6,003,139 A | 12/1999 | McKenzie |
| 6,008,519 A | 12/1999 | Yuan et al. |
| 6,011,703 A | 1/2000 | Boylan et al. |
| 6,034,489 A | 3/2000 | Weng |
| 6,038,154 A | 3/2000 | Boylan et al. |
| 6,046,664 A | 4/2000 | Weller et al. |
| 6,060,943 A | 5/2000 | Jansen |
| 6,067,237 A | 5/2000 | Nguyen |
| 6,069,798 A | 5/2000 | Liu |
| 6,069,799 A | 5/2000 | Bowman et al. |
| 6,078,510 A | 6/2000 | Spampinato et al. |
| 6,084,792 A | 7/2000 | Chen et al. |
| 6,094,038 A | 7/2000 | Lethellier |
| 6,097,046 A | 8/2000 | Plumton |
| 6,125,046 A | 9/2000 | Jang et al. |
| 6,144,187 A | 11/2000 | Bryson |
| 6,147,886 A | 11/2000 | Wittenbreder |
| 6,156,611 A | 12/2000 | Lan et al. |
| 6,160,374 A | 12/2000 | Hayes et al. |
| 6,160,721 A | 12/2000 | Kossives et al. |
| 6,163,466 A | 12/2000 | Davila, Jr. et al. |
| 6,181,231 B1 | 1/2001 | Bartilson |
| 6,188,586 B1 | 2/2001 | Farrington et al. |
| 6,191,964 B1 | 2/2001 | Boylan et al. |
| 6,208,535 B1 | 3/2001 | Parks |
| 6,212,084 B1 | 4/2001 | Turner |
| 6,215,290 B1 | 4/2001 | Yang et al. |
| 6,218,891 B1 | 4/2001 | Lotfi et al. |
| 6,229,197 B1 | 5/2001 | Plumton et al. |
| 6,262,564 B1 | 7/2001 | Kanamori |
| 6,288,501 B1 | 9/2001 | Nakamura et al. |
| 6,288,920 B1 | 9/2001 | Jacobs |
| 6,295,217 B1 | 9/2001 | Yang et al. |
| 6,304,460 B1 | 10/2001 | Cuk |
| 6,309,918 B1 | 10/2001 | Huang et al. |

(56) References Cited

U.S. PATENT DOCUMENTS

| | | | |
|---|---|---|---|
| 6,317,021 B1 | 11/2001 | Jansen | |
| 6,317,337 B1 | 11/2001 | Yasumuar | |
| 6,320,490 B1 | 11/2001 | Clayton | |
| 6,323,090 B1 | 11/2001 | Zommer | |
| 6,325,035 B1 | 12/2001 | Codina et al. | |
| 6,344,986 B1 | 2/2002 | Jain et al. | |
| 6,348,848 B1 | 2/2002 | Herbert | |
| 6,351,396 B1 | 2/2002 | Jacobs | |
| 6,356,462 B1 | 3/2002 | Jang et al. | |
| 6,362,986 B1 | 3/2002 | Schultz et al. | |
| 6,373,727 B1 | 4/2002 | Hedenskog et al. | |
| 6,373,734 B1 | 4/2002 | Martinelli | |
| 6,380,836 B2 | 4/2002 | Matsumoto et al. | |
| 6,388,898 B1 | 5/2002 | Fan et al. | |
| 6,392,902 B1 | 5/2002 | Jang et al. | |
| 6,396,718 B1 | 5/2002 | Ng et al. | |
| 6,400,579 B2 | 6/2002 | Cuk | |
| 6,414,578 B1 | 7/2002 | Jitaru | |
| 6,418,039 B2 | 7/2002 | Lentini et al. | |
| 6,438,009 B2 | 8/2002 | Assow | |
| 6,445,598 B1 | 9/2002 | Yamada | |
| 6,445,599 B1 * | 9/2002 | Nguyen | H02M 3/1584 363/25 |
| 6,462,965 B1 | 10/2002 | Uesono | |
| 6,466,461 B2 | 10/2002 | Mao et al. | |
| 6,469,564 B1 | 10/2002 | Jansen | |
| 6,477,065 B2 | 11/2002 | Parks | |
| 6,483,724 B1 | 11/2002 | Blair et al. | |
| 6,489,754 B2 | 12/2002 | Blom | |
| 6,498,367 B1 | 12/2002 | Chang et al. | |
| 6,501,193 B1 | 12/2002 | Krugly | |
| 6,504,321 B2 | 1/2003 | Giannopoulos et al. | |
| 6,512,352 B2 | 1/2003 | Qian | |
| 6,525,603 B1 | 2/2003 | Morgan | |
| 6,539,299 B2 | 3/2003 | Chatfield et al. | |
| 6,545,453 B2 | 4/2003 | Glinkowski et al. | |
| 6,548,992 B1 | 4/2003 | Alcantar et al. | |
| 6,549,436 B1 | 4/2003 | Sun | |
| 6,552,917 B1 | 4/2003 | Bourdillon | |
| 6,559,689 B1 | 5/2003 | Clark | |
| 6,563,725 B2 | 5/2003 | Carsten | |
| 6,570,268 B1 | 5/2003 | Perry et al. | |
| 6,580,627 B2 | 6/2003 | Toshino | |
| 6,597,588 B2 | 7/2003 | Matsumoto | |
| 6,608,768 B2 | 8/2003 | Sula | |
| 6,611,132 B2 | 8/2003 | Nakagawa et al. | |
| 6,614,206 B1 | 9/2003 | Wong et al. | |
| 6,636,025 B1 | 10/2003 | Irissou | |
| 6,654,259 B2 | 11/2003 | Koshita et al. | |
| 6,661,276 B1 | 12/2003 | Chang | |
| 6,668,296 B1 | 12/2003 | Dougherty et al. | |
| 6,674,658 B2 | 1/2004 | Mao et al. | |
| 6,683,797 B2 | 1/2004 | Ziatsu et al. | |
| 6,687,137 B1 | 2/2004 | Yasumuar | |
| 6,696,910 B2 | 2/2004 | Nuytkens et al. | |
| 6,731,486 B2 | 5/2004 | Holt et al. | |
| 6,741,099 B1 | 5/2004 | Krugly | |
| 6,751,106 B2 | 6/2004 | Zhang et al. | |
| 6,753,723 B2 | 6/2004 | Zhang | |
| 6,765,810 B2 | 7/2004 | Perry | |
| 6,784,644 B2 | 8/2004 | Xu et al. | |
| 6,804,125 B2 | 10/2004 | Brkovic | |
| 6,813,170 B2 | 11/2004 | Yang | |
| 6,831,847 B2 | 12/2004 | Perry | |
| 6,839,247 B1 | 1/2005 | Yang et al. | |
| 6,856,149 B2 | 2/2005 | Yang | |
| 6,862,194 B2 | 3/2005 | Yang et al. | |
| 6,867,678 B2 | 3/2005 | Yang | |
| 6,867,986 B2 | 3/2005 | Yang | |
| 6,873,237 B2 | 3/2005 | Chandrasaekaran et al. | |
| 6,882,548 B1 | 4/2005 | Chandrasekaran et al. | |
| 6,906,934 B2 | 6/2005 | Yang et al. | |
| 6,943,553 B2 | 9/2005 | Zimmerman | |
| 6,944,033 B1 | 9/2005 | Xu et al. | |
| 6,977,824 B1 | 12/2005 | Yang et al. | |
| 6,980,077 B1 | 12/2005 | Chandrasekaran et al. | |
| 6,982,887 B2 | 1/2006 | Batarseh et al. | |
| 7,009,486 B1 | 3/2006 | Goeke et al. | |
| 7,012,414 B1 | 3/2006 | Mehrotra et al. | |
| 7,016,204 B2 | 3/2006 | Yang et al. | |
| 7,023,679 B2 | 4/2006 | Tomiyama | |
| 7,026,807 B2 | 4/2006 | Anderson et al. | |
| 7,034,586 B2 | 4/2006 | Mehas et al. | |
| 7,034,647 B2 | 4/2006 | Yan et al. | |
| 7,046,523 B2 | 5/2006 | Sun et al. | |
| 7,061,358 B1 | 6/2006 | Yang | |
| 7,072,189 B2 | 7/2006 | Kim | |
| 7,075,799 B2 | 7/2006 | Qu | |
| 7,076,360 B1 | 7/2006 | Ma | |
| 7,095,638 B2 | 8/2006 | Uusitalo | |
| 7,099,163 B1 | 8/2006 | Ying | |
| 7,136,293 B2 | 11/2006 | Petkov et al. | |
| 7,148,669 B2 | 12/2006 | Maksimovic et al. | |
| 7,170,268 B2 | 1/2007 | Kim | |
| 7,176,662 B2 | 2/2007 | Chandrasekaran | |
| 7,209,024 B2 | 4/2007 | Nakahori | |
| 7,265,559 B1 * | 9/2007 | Hladky | G01N 17/02 204/404 |
| 7,269,038 B2 | 9/2007 | Shekhawat et al. | |
| 7,280,026 B2 | 10/2007 | Chandrasekaran et al. | |
| 7,285,807 B2 | 10/2007 | Brar et al. | |
| 7,298,118 B2 | 11/2007 | Chandrasekaran | |
| 7,301,785 B2 | 11/2007 | Yasumura | |
| 7,312,686 B2 | 12/2007 | Bruno | |
| 7,321,283 B2 | 1/2008 | Mehrotra et al. | |
| 7,332,992 B2 | 2/2008 | Iwai | |
| 7,339,208 B2 | 3/2008 | Brar et al. | |
| 7,339,801 B2 | 3/2008 | Yasumura | |
| 7,348,612 B2 | 3/2008 | Sriram et al. | |
| 7,362,592 B2 | 4/2008 | Yang et al. | |
| 7,362,593 B2 | 4/2008 | Yang et al. | |
| 7,375,607 B2 | 5/2008 | Lee et al. | |
| 7,375,994 B2 | 5/2008 | Andreycak | |
| 7,385,375 B2 | 6/2008 | Rozman | |
| 7,386,404 B2 | 6/2008 | Cargonja et al. | |
| 7,393,247 B1 | 7/2008 | Yu et al. | |
| 7,417,875 B2 | 8/2008 | Chandrasekaran et al. | |
| 7,427,910 B2 | 9/2008 | Mehrotra et al. | |
| 7,431,862 B2 | 10/2008 | Mehrotra et al. | |
| 7,439,556 B2 | 10/2008 | Brar et al. | |
| 7,439,557 B2 | 10/2008 | Brar et al. | |
| 7,446,512 B2 | 11/2008 | Nishihara et al. | |
| 7,447,049 B2 | 11/2008 | Garner et al. | |
| 7,453,709 B2 | 11/2008 | Park et al. | |
| 7,462,891 B2 | 12/2008 | Brar et al. | |
| 7,468,649 B2 | 12/2008 | Chandrasekaran | |
| 7,471,527 B2 | 12/2008 | Chen | |
| 7,489,225 B2 | 2/2009 | Indika de Silva et al. | |
| 7,554,430 B2 | 6/2009 | Mehrotra et al. | |
| 7,558,037 B1 | 7/2009 | Gong et al. | |
| 7,567,445 B2 | 7/2009 | Coulson et al. | |
| 7,583,555 B2 | 9/2009 | Kang et al. | |
| 7,626,370 B1 | 12/2009 | Mei et al. | |
| 7,630,219 B2 | 12/2009 | Lee | |
| 7,633,369 B2 | 12/2009 | Chandrasekaran et al. | |
| 7,646,616 B2 | 1/2010 | Wekhande | |
| 7,663,183 B2 | 2/2010 | Brar et al. | |
| 7,667,986 B2 | 2/2010 | Artusi et al. | |
| 7,675,758 B2 | 3/2010 | Artusi et al. | |
| 7,675,759 B2 | 3/2010 | Artusi et al. | |
| 7,675,764 B2 | 3/2010 | Chandrasekaran et al. | |
| 7,715,217 B2 | 5/2010 | Manabe et al. | |
| 7,733,679 B2 | 6/2010 | Luger et al. | |
| 7,746,041 B2 | 6/2010 | Xu et al. | |
| 7,778,050 B2 | 8/2010 | Yamashita | |
| 7,778,051 B2 | 8/2010 | Yang | |
| 7,787,264 B2 | 8/2010 | Yang | |
| 7,791,903 B2 | 9/2010 | Zhang | |
| 7,795,849 B2 | 9/2010 | Sohma | |
| 7,800,354 B2 * | 9/2010 | Kanouda | H02M 1/4225 323/284 |
| 7,813,101 B2 | 10/2010 | Morikawa | |
| 7,847,535 B2 | 12/2010 | Meynard et al. | |
| 7,876,191 B2 | 1/2011 | Chandrasekaran et al. | |

(56) References Cited

U.S. PATENT DOCUMENTS

| | | |
|---|---|---|
| 7,889,517 B2 | 2/2011 | Artusi et al. |
| 7,889,521 B2 | 2/2011 | Hsu |
| 7,906,941 B2 | 3/2011 | Jayaraman et al. |
| 7,940,035 B2 | 5/2011 | Yang |
| 7,965,528 B2 | 6/2011 | Yang et al. |
| 7,983,063 B2 | 7/2011 | Lu et al. |
| 8,004,112 B2 | 8/2011 | Koga et al. |
| 8,125,205 B2 | 2/2012 | Chandrrasekaran et al. |
| 8,134,443 B2 | 3/2012 | Chandrasekaran et al. |
| 8,179,699 B2 | 5/2012 | Tumminaro et al. |
| 8,184,456 B1 | 5/2012 | Jain et al. |
| 8,278,889 B2 | 10/2012 | Tataeishi |
| 8,363,439 B2 | 1/2013 | Yang |
| 8,415,737 B2 | 4/2013 | Brar et al. |
| 8,467,199 B2 | 6/2013 | Lee et al. |
| 8,488,355 B2 | 7/2013 | Berghegger |
| 8,502,461 B2 | 8/2013 | Shiu et al. |
| 8,520,414 B2 | 8/2013 | Garrity et al. |
| 8,520,420 B2 | 8/2013 | Jungreis et al. |
| 8,638,578 B2 | 1/2014 | Zhang |
| 8,643,222 B2 | 2/2014 | Brinlee et al. |
| 8,664,893 B2 | 3/2014 | Lee et al. |
| 8,749,174 B2 | 6/2014 | Angeles |
| 8,767,418 B2 | 7/2014 | Jungreis et al. |
| 8,787,043 B2 | 7/2014 | Berghegger |
| 8,792,256 B2 | 7/2014 | Berghegger |
| 8,792,257 B2 | 7/2014 | Berghegger |
| 8,976,549 B2 | 3/2015 | genannt Berghegger |
| 9,035,624 B1 * | 5/2015 | Rahimi ............... H02M 3/156 323/224 |
| 9,077,248 B2 | 7/2015 | Brinlee |
| 9,088,216 B2 | 7/2015 | Garrity et al. |
| 2001/0020886 A1 | 9/2001 | Matsumoto et al. |
| 2001/0024373 A1 | 9/2001 | Cuk |
| 2001/0055216 A1 | 12/2001 | Shirato |
| 2002/0044463 A1 | 4/2002 | Bontempo et al. |
| 2002/0057080 A1 | 5/2002 | Telefus et al. |
| 2002/0071295 A1 | 6/2002 | Nishikawa |
| 2002/0101741 A1 | 8/2002 | Brkovic |
| 2002/0110005 A1 | 8/2002 | Mao et al. |
| 2002/0114172 A1 | 8/2002 | Webb et al. |
| 2002/0145888 A1 | 10/2002 | Yoshinaga et al. |
| 2002/0167385 A1 | 11/2002 | Ackermann |
| 2002/0176262 A1 | 11/2002 | Tripathi et al. |
| 2003/0030422 A1 | 2/2003 | Sula |
| 2003/0039129 A1 | 2/2003 | Miyazaki et al. |
| 2003/0063483 A1 | 4/2003 | Carsten |
| 2003/0063484 A1 | 4/2003 | Carsten |
| 2003/0076079 A1 | 4/2003 | Alcantar et al. |
| 2003/0086279 A1 | 5/2003 | Bourdillon |
| 2003/0198067 A1 | 10/2003 | Sun |
| 2004/0032754 A1 | 2/2004 | Dismukes et al. |
| 2004/0064621 A1 | 4/2004 | Dougherty |
| 2004/0174147 A1 | 9/2004 | Vinciarelli |
| 2004/0196672 A1 | 10/2004 | Amei |
| 2004/0200631 A1 | 10/2004 | Chen |
| 2004/0217794 A1 | 11/2004 | Strysko |
| 2004/0257095 A1 | 12/2004 | Yang |
| 2005/0024179 A1 | 2/2005 | Chandrasekaran et al. |
| 2005/0036337 A1 * | 2/2005 | Zhang ............... H02M 3/1584 363/17 |
| 2005/0046404 A1 | 3/2005 | Uusitalo |
| 2005/0052224 A1 | 3/2005 | Yang et al. |
| 2005/0052886 A1 | 3/2005 | Yang |
| 2005/0207189 A1 | 9/2005 | Chen |
| 2005/0245658 A1 | 11/2005 | Mehrotra et al. |
| 2005/0254266 A1 | 11/2005 | Jitaru |
| 2005/0254268 A1 | 11/2005 | Reinhard |
| 2005/0281058 A1 | 12/2005 | Batarseh et al. |
| 2005/0286270 A1 | 12/2005 | Petkov et al. |
| 2006/0006975 A1 | 1/2006 | Jitaru et al. |
| 2006/0006976 A1 | 1/2006 | Bruno |
| 2006/0007713 A1 | 1/2006 | Brown |
| 2006/0018136 A1 | 1/2006 | Takahashi |
| 2006/0022648 A1 * | 2/2006 | Ben-Yaakov ....... H02M 1/4225 323/222 |
| 2006/0038549 A1 | 2/2006 | Mehrotra et al. |
| 2006/0038649 A1 | 2/2006 | Mehrotra et al. |
| 2006/0038650 A1 | 2/2006 | Mehrotra et al. |
| 2006/0044845 A1 | 3/2006 | Fahlenkamp |
| 2006/0091430 A1 | 5/2006 | Sriram et al. |
| 2006/0109698 A1 | 5/2006 | Qu |
| 2006/0187684 A1 | 8/2006 | Chandrasekaran et al. |
| 2006/0197510 A1 * | 9/2006 | Chandrasekaran . H02M 3/1588 323/222 |
| 2006/0198173 A1 | 9/2006 | Rozman |
| 2006/0226477 A1 | 10/2006 | Brar et al. |
| 2006/0226478 A1 | 10/2006 | Brar et al. |
| 2006/0227576 A1 | 10/2006 | Yasumura |
| 2006/0237968 A1 | 10/2006 | Chandrasekaran |
| 2006/0255360 A1 | 11/2006 | Brar et al. |
| 2006/0271315 A1 | 11/2006 | Cargonja et al. |
| 2006/0286865 A1 | 12/2006 | Chou et al. |
| 2007/0007945 A1 | 1/2007 | King et al. |
| 2007/0010298 A1 | 1/2007 | Chang |
| 2007/0019356 A1 | 1/2007 | Morikawa |
| 2007/0025124 A1 | 2/2007 | Hansson |
| 2007/0030717 A1 | 2/2007 | Luger et al. |
| 2007/0041224 A1 | 2/2007 | Moyse et al. |
| 2007/0045765 A1 | 3/2007 | Brar et al. |
| 2007/0058402 A1 | 3/2007 | Shekhawat et al. |
| 2007/0069286 A1 | 3/2007 | Brar et al. |
| 2007/0114979 A1 | 5/2007 | Chandrasekaran |
| 2007/0120953 A1 | 5/2007 | Koga et al. |
| 2007/0121351 A1 | 5/2007 | Zhang et al. |
| 2007/0139984 A1 | 6/2007 | Lo |
| 2007/0159857 A1 | 7/2007 | Lee |
| 2007/0206523 A1 | 9/2007 | Huynh et al. |
| 2007/0241721 A1 | 10/2007 | Weinstein et al. |
| 2007/0257650 A1 | 11/2007 | Southwell |
| 2007/0274106 A1 | 11/2007 | Coulson et al. |
| 2007/0274107 A1 | 11/2007 | Garner et al. |
| 2007/0296383 A1 | 12/2007 | Xu |
| 2007/0298559 A1 | 12/2007 | Brar et al. |
| 2007/0298564 A1 | 12/2007 | Brar et al. |
| 2008/0012423 A1 | 1/2008 | Mimran |
| 2008/0012802 A1 | 1/2008 | Lin |
| 2008/0024094 A1 | 1/2008 | Nishihara et al. |
| 2008/0030178 A1 | 2/2008 | Leonard et al. |
| 2008/0031021 A1 | 2/2008 | Ros et al. |
| 2008/0037294 A1 | 2/2008 | Indika de Silva et al. |
| 2008/0043503 A1 | 2/2008 | Yang |
| 2008/0054874 A1 | 3/2008 | Chandrasekaran et al. |
| 2008/0061746 A1 | 3/2008 | Kobayashi et al. |
| 2008/0080219 A1 | 4/2008 | Sohma |
| 2008/0137381 A1 | 6/2008 | Beasley |
| 2008/0164859 A1 * | 7/2008 | Peng ............... H02M 3/157 323/318 |
| 2008/0198638 A1 | 8/2008 | Reinberger et al. |
| 2008/0205104 A1 | 8/2008 | Lev et al. |
| 2008/0278092 A1 | 11/2008 | Lys |
| 2008/0298106 A1 | 12/2008 | Tateishi |
| 2008/0316779 A1 * | 12/2008 | Jayaraman ......... H02M 1/4225 363/74 |
| 2009/0002054 A1 | 1/2009 | Tsunoda et al. |
| 2009/0037768 A1 | 2/2009 | Adams |
| 2009/0046486 A1 | 2/2009 | Lu et al. |
| 2009/0072626 A1 | 3/2009 | Watanabe et al. |
| 2009/0091957 A1 | 4/2009 | Orr |
| 2009/0128101 A1 * | 5/2009 | Skinner ............... H02M 3/1584 323/220 |
| 2009/0257257 A1 * | 10/2009 | Adragna ............. H02M 3/1584 363/65 |
| 2009/0273957 A1 | 11/2009 | Feldtkeller |
| 2009/0284994 A1 | 11/2009 | Lin et al. |
| 2009/0289557 A1 | 11/2009 | Itoh et al. |
| 2009/0290385 A1 | 11/2009 | Jungreis et al. |
| 2009/0290395 A1 * | 11/2009 | Osaka ............... H02M 1/4225 363/126 |
| 2009/0310388 A1 | 12/2009 | Yang |
| 2009/0315530 A1 | 12/2009 | Baranwal |
| 2010/0000879 A1 * | 1/2010 | Hladky ............... G01N 17/02 205/775.5 |

(56) References Cited

U.S. PATENT DOCUMENTS

| | | |
|---|---|---|
| 2010/0020578 A1 | 1/2010 | Ryu et al. |
| 2010/0054000 A1 | 3/2010 | Huynh |
| 2010/0066336 A1 | 3/2010 | Araki et al. |
| 2010/0066337 A1* | 3/2010 | Gong ............... H02M 1/4225 323/285 |
| 2010/0091522 A1 | 4/2010 | Chandrasekaran et al. |
| 2010/0097041 A1* | 4/2010 | Ayukawa ........... H02M 1/4225 323/272 |
| 2010/0097828 A1* | 4/2010 | Chen ................ H02M 3/1584 363/72 |
| 2010/0123447 A1 | 5/2010 | Vecera |
| 2010/0123486 A1 | 5/2010 | Berghegger |
| 2010/0149838 A1 | 6/2010 | Artusi et al. |
| 2010/0164400 A1 | 7/2010 | Adragna |
| 2010/0164443 A1 | 7/2010 | Tumminaro et al. |
| 2010/0181970 A1* | 7/2010 | Yang ................ H02M 3/1584 323/218 |
| 2010/0182806 A1 | 7/2010 | Garrity et al. |
| 2010/0188876 A1 | 7/2010 | Garrity et al. |
| 2010/0202165 A1 | 8/2010 | Zheng et al. |
| 2010/0202167 A1 | 8/2010 | Yang |
| 2010/0213989 A1 | 8/2010 | Nakatake |
| 2010/0219802 A1 | 9/2010 | Lin et al. |
| 2010/0254168 A1 | 10/2010 | Chandrasekaran |
| 2010/0321958 A1 | 12/2010 | Brinlee et al. |
| 2010/0321964 A1 | 12/2010 | Brinlee et al. |
| 2011/0025289 A1 | 2/2011 | Wang et al. |
| 2011/0038179 A1 | 2/2011 | Zhang |
| 2011/0062926 A1 | 3/2011 | Qiu et al. |
| 2011/0080102 A1 | 4/2011 | Ge et al. |
| 2011/0089917 A1 | 4/2011 | Chen et al. |
| 2011/0095730 A1 | 4/2011 | Strijker et al. |
| 2011/0110132 A1* | 5/2011 | Rausch ............. H02M 1/4225 363/124 |
| 2011/0149607 A1 | 6/2011 | Jungreis et al. |
| 2011/0157936 A1 | 6/2011 | Huynh |
| 2011/0182089 A1 | 7/2011 | Berghegger |
| 2011/0188273 A1* | 8/2011 | Pansier ............. H02M 1/4225 363/44 |
| 2011/0239008 A1 | 9/2011 | Lam et al. |
| 2011/0241738 A1 | 10/2011 | Tamaoka |
| 2011/0267856 A1 | 11/2011 | Pansier |
| 2011/0291591 A1 | 12/2011 | Shiu et al. |
| 2011/0305047 A1 | 12/2011 | Jungreis et al. |
| 2012/0020119 A1 | 1/2012 | Tang et al. |
| 2012/0243271 A1 | 9/2012 | Berghegger |
| 2012/0250378 A1 | 10/2012 | Kok et al. |
| 2012/0294048 A1 | 11/2012 | Brinlee |
| 2013/0003430 A1 | 1/2013 | Reddy |
| 2013/0051095 A1* | 2/2013 | Iwata ............... H02M 1/4225 363/81 |
| 2013/0070485 A1* | 3/2013 | Li ................. H02M 1/4258 363/21.01 |
| 2013/0134894 A1 | 5/2013 | Kuang |
| 2013/0229829 A1 | 9/2013 | Zhang et al. |
| 2013/0250627 A1 | 9/2013 | Herfurth |
| 2014/0081474 A1* | 3/2014 | Blakeley ............. G06F 1/26 700/291 |
| 2014/0091718 A1 | 4/2014 | Brinlee |
| 2014/0091720 A1 | 4/2014 | Brinlee |
| 2014/0152271 A1* | 6/2014 | Jeong ............... H02M 1/4225 323/207 |
| 2014/0254215 A1 | 9/2014 | Brinlee et al. |
| 2014/0301111 A1 | 10/2014 | Jungreis et al. |
| 2015/0023077 A1* | 1/2015 | Earanky ............ H02M 1/4208 363/89 |
| 2015/0078050 A1* | 3/2015 | Colbeck ............ H02M 7/066 363/126 |
| 2015/0098254 A1 | 4/2015 | Brinlee et al. |

FOREIGN PATENT DOCUMENTS

| | | |
|---|---|---|
| CN | 2904469 Y | 5/2007 |
| CN | 101106850 A | 1/2008 |
| CN | 101123395 A | 2/2008 |
| CN | 101141099 | 3/2008 |
| CN | 201252294 | 6/2009 |
| CN | 101834541 A | 9/2010 |
| CN | 102315765 A | 1/2012 |
| CN | 102412727 A | 4/2012 |
| CN | 102695325 A | 9/2012 |
| CN | 101489335 B | 12/2012 |
| CN | 101789701 B | 8/2014 |
| DE | 10112820 A1 | 10/2002 |
| DE | 10310361 | 9/2004 |
| DE | 10352509 A1 | 6/2005 |
| DE | 102014104899 A1 | 11/2014 |
| EP | 0665634 | 8/1995 |
| JP | 57097361 | 6/1982 |
| JP | 3-215911 | 9/1991 |
| JP | 2000-68132 | 3/2000 |
| JP | 2008283818 A | 11/2008 |
| WO | 8700991 | 2/1987 |
| WO | 03088463 A1 | 10/2003 |
| WO | 2010083511 | 7/2010 |
| WO | 2010083514 | 7/2010 |
| WO | 2011116225 | 9/2011 |

OTHER PUBLICATIONS

AN100: Application NoteusingLxIOO Family of High Performance N-Ch JFET Transistors, AN100.Rev 1.01, Sep. 2003, 5 pp., Lovoltech, Inc., Santa Clara, CA.

AN101A: Gate Drive Network for a Power JFET, AN101A.Rev 1.2, Nov. 2003, 2 pp., Lovoltech, Inc., Santa Clara, CA.

AN108: Applications Note: How to Use Power JFETs® and MOSFETs Interchangeably in Low-Side Applications, Rev. 1.0.1, Feb. 14, 2005, 4 pp. Lovoltech, Inc., Santa Clara, CA.

Ajram, S., et al., "Ultrahigh Frequency DC-to-DC Converters Using GaAs Power Switches," IEEE Transactions on Power Electronics, Sep. 2001, pp. 594-602, vol. 16, No. 5, IEEE, Los Alamitos, CA.

Bill Andreycak, Active Clamp and Reset Technique Enhances Forward Converter Performance, Oct. 1994, Texas Instruments, 19 pages.

Balogh, L., et al., "Power-Factor Correction with Interleaved Boost Converters in Continuous-Inductor-Current Mode," IEEE Proceedings of APEC, pp. 168-174, 1993, IEEE, Los Alamitos, CA.

Biernacki, J., et al., "Radio Frequency DC-DC Flyback Converter," Proceedings of the 43rd IEEE Midwest Symposium on Circuits and Systems, Aug. 8-11, 2000, pp. 94-97, vol. 1, IEEE, Los Alamitos, CA.

Chen, W., et al., "Design of High Efficiency, Low Profile, Low Voltage Converter with Integrated Magnetics," Proceedings of 1997 IEEE Applied Power Electronics Conference (APEC '97), 1997, pp. 911-917, IEEE, Los Alamitos, CA.

Chhawchharia, P., et al., "On the Reduction of Component Count in Switched Capacitor DC/DC Convertors," Hong Kong Polytechnic University, IEEE, 1997, Hung Hom, Kowloon, Hong King, pp. 1395-1401.

Curtis, K., "Advances in Microcontroller Peripherals Facilitate Current-Mode for Digital Power Supplies," Digital Power Forum '06, 4 pp., Sep. 2006, Darnell Group, Richardson, TX.

Eisenbeiser, K., et al., "Manufacturable GaAs VFET for Power Switching Applications," IEEE Electron Device Letters, Apr. 2000, pp. 144-145, vol. 21, No. 4, IEEE.

Freescale Semiconductor, "Design of a Digital AC/DC SMPS using the 56F8323 Device, Designer Reference Manual, 56800E 16-bit Digital Signal Controllers", DRM074, Rev. 0, Aug. 2005 (108 pages).

Freescale Semiconductor, "56F8323/56F8123 Data Sheet Preliminary Technical Data, 56F8300 16-bit Digital Signal Controllers," MC56F8323 Rev. 17, Apr. 2007 (140 pages).

Gaye, M., et al., "A 50-100 MHz 5V to -5V, 1W Cuk Converter Using Gallium Arsenide Power Switches," ISCAS 2000—IEEE International Symposium on Circuits and Systems, May 28-31, 2000, pp. I-264-I-267, vol. 1, IEEE, Geneva, Switzerland.

Goldberg, A.F., et al., "Issues Related to 1-10-MHz Transformer Design," IEEE Transactions on Power Electronics, Jan. 1989, pp. 113-123, vol. 4, No. 1, IEEE, Los Alamitos, CA.

(56) References Cited

OTHER PUBLICATIONS

Goldberg, A.F., et al., "Finite-Element Analysis of Copper Loss in 1-10-MHz Transformers," IEEE Transactions on Power Electronics, Apr. 1989, pp. 157-167, vol. 4, No. 2, IEEE, Los Alamitos, CA.

Jitaru, I.D., et al., "Quasi-Integrated Magnetic an Avenue for Higher Power Density and Efficiency in Power Converters," Twelfth Annual Applied Power Electronics Conference and Exposition, Feb. 23-27, 1997, pp. 395-402, vol. 1, IEEE, Los Alamitos, CA.

Kollman, R., et al., "10 MHz PWM Converters with GaAs VFETs," IEEE Eleventh Annual Applied Power Electronics Conference and Exposition, Mar. 1996, pp. 264-269, vol. 1, IEEE.

Kuwabara, K., et al., "Switched-Capacitor DC-DC Converters," Fujitsu Limited, IEEE, 1988, Kawasaki, Japan, pp. 213-218.

Lee, P.-W., et al., "Steady-State Analysis of an Interleaved Boost Converter with Coupled Inductors," IEEE Transactions on Industrial Electronics, Aug. 2000, pp. 787-795, vol. 47, No. 4, IEEE, Los Alamitos, CA.

Lenk, R., "Introduction to the Tapped Buck Converter," PCIM 2000, HFPC 2000 Proceedings, Oct. 2000, pp. 155-166.

Liu, W., "Fundamentals of III-V Devices: HBTs, MESFETs, and HFETs/HEMTs," §5-5: Modulation Doping, 1999, pp. 323-330, John Wiley & Sons, New York, NY.

Maksimović, D., et al., "Switching Converters with Wide DC Conversion Range," IEEE Transactions on Power Electronics, Jan. 1991, pp. 151-157, vol. 6, No. 1, IEEE, Los Alamitos, CA.

Maxim, Application Note 725, www.maxim-ic.com/an725, Maxim Integrated Products, Nov. 29, 2001, 8 pages.

Miwa, B.A., et al., "High Efficiency Power Factor Correction Using Interleaving Techniques," IEEE Proceedings of APEC, 1992, pp. 557-568, IEEE, Los Alamitos, CA.

Middlebrook, R.D., "Transformerless DC-to-DC Converters with Large Conversion Ratios," IEEE Transactions on Power Electronics, Oct. 1988, pp. 484-488, vol. 3, No. 4, IEEE, Los Alamitos, CA.

National Semiconductor Corporation, "LMC7660 Switched Capacitor Voltage Converter," www.national.com, Apr. 1997, 12 pages.

National Semiconductor Corporation, "LM2665 Switched Capacitor Voltage Converter," www.national.com, Sep. 2005, 9 pages.

Nguyen, L.D., et al., "Ultra-High-Speed Modulation-Doped Field Effect Transistors: A Tutorial Review," Proceedings of the IEEE, Apr. 1992, pp. 494-518, vol. 80, No. 4, IEEE.

Niemela, V.A., et al., "Comparison of GaAs and Silicon Synchronous Rectifiers in a 3.3V Out, SOW DC-DC Converter," 27th Annual, IEEE Power Electronics Specialists Conference, Jun. 1996, pp. 861-867, vol. 1, IEEE.

Ninomiya, T., et al., "Static and Dynamic Analysis of Zero-Voltage Switched Half-Bridge Converter with PWM Control," Proceedings of 1991 IEEE Power Electronics Specialists Conference (PESC '91), 1991, pp. 230-237, IEEE, Los Alamitos, CA.

O'Meara, K., "A New Output Rectifier Configuration Optimized for High Frequency Operation," Proceedings of 1991 High Frequency Power Conversion (HFPC '91) Conference, Jun. 1991, pp. 219-225, Toronto, CA.

Pietkiewicz, A., et al. "Coupled-Inductor Current-Doubler Topology in Phase-Shifted Full-Bridge DC-DC Converter," Proceedings of INTELEC '98, 1998, 9 pp., Paper 2-3, IEEE, Los Alamitos, CA.

Peppel, M., et al., "Optimized Reverse Diode Operation of Power MOSFETs," 2000 IEEE Industry Applications Conference, Oct. 8, 2000, pp. 2961-2965, vol. 5, IEEE, Los Alamitos, CA.

Plumton, D.L., et al., "A Low On-Resistance High-Current GaAs Power VFET," IEEE Electron Device Letters, Apr. 1995, pp. 142-144, vol. 16, No. 4, IEEE.

Rajeev, M., "An Input Current Shaper with Boost and Flyback Converter Using Integrated Magnetics," Power Electronics and Drive Systems, Fifth International Conference on Power Electronics and Drive Systems 2003, Nov. 17-20, 2003, pp. 327-331, vol. 1, IEEE, Los Alamitos, CA.

Rico, M., et al., "Static and Dynamic Modeling of Tapped-Inductor DC-to-DC Converters," 1987, pp. 281-288, IEEE, Los Alamitos, CA.

Severns, R., "Circuit Reinvention in Power Electronics and Identification of Prior Work," Proceedings of 1997 IEEE Applied Power Electronics Conference (APEC '97), 1997, pp. 3-9, IEEE, Los Alamitos, CA.

Severns, R., "Circuit Reinvention in Power Electronics and Identification of Prior Work," IEEE Transactions on Power Electronics, Jan. 2001, pp. 1-7, vol. 16, No. 1, IEEE, Los Alamitos, CA.

Sun, J., et al., "Unified Analysis of Half-Bridge Converters with Current-Doubler Rectifier," Proceedings of 2001 IEEE Applied Power Electronics Conference, 2001, pp. 514-520, IEEE, Los Alamitos, CA.

Sun, J., et al., "An Improved current-Doubler Rectifier with Integrated Magnetics," 17th Annual Applied Power Electronics Conference and Exposition (APEC), 2002, 831-837, vol. 2, IEEEE, Dallas, TX.

Texas Instruments Incorporated, "LT1054, LT1054Y Switched-Capacitor Voltage Converters With Regulators," SLVS033C, Feb. 1990—Revised Jul. 1998, 25 pages.

Thaker, M., et al., "Adaptive/Intelligent Control and Power Management Reduce Power Dissipation and Consumption," Digital Power Forum '06, 11 pp., Sep. 2006, Darnell Group, Richardson, TX.

Vallamkonda, S., "Limitations of Switching Voltage Regulators," A Thesis in Electrical Engineering, Texas Tech University, May 2004, 89 pages.

Wei, J., et al., "Comparison of Three Topology Candidates for 12V VRM," IEEE APEC, 2001, pp. 245-251, IEEE, Los Alamitos, CA.

Weitzel, C.E., "RF Power Devices for Wireless Communications," 2002, 2002 IEEE MTT-S CDROM, paper TU4B-I, IEEE.

Williams, R., "Modern GaAs Processing Methods," 1990, pp. 66-67, Artech House, Inc., Norwood, MA.

Wong, P.-L., et al., "Investigating Coupling Inductors in the Interleaving QSW VRM," 15th Annual Applied Power Electronics Conference and Exposition (APEC 2000), Feb. 2000, pp. 973-978, vol. 2, IEEE, Los Alamitos, CA.

Xu, P., et al., "A Novel Integrated Current Doubler Rectifier," IEEE 2000 Applied Power Electronics Conference, Mar. 2000, pp. 735-740, IEEE, Los Alamitos, CA.

Xu, et al., Design of 48V Voltage Regulator Modules with a Novel Integrated Magnetics, IEEE Transactions on Power Electronics, vol. 17, No. 6 (Nov. 2002), pp. 990-998.

Xu, P., et al., "Design and Performance Evaluation of Multi-channel Interleaved Quasi-Square-Wave Buck Voltage Regulator Module," HFPC 2000 Proceedings, Oct. 2000, pp. 82-88.

Xu, M., et al., "Voltage Divider and its Application in the Two-stage Power Architecture," Center for Power Electronics Systems, Virginia Polytechnic Institute and State University, IEEE, 2006, Blacksburg, Virginia, pp. 499-505.

Xu, P., et al., "A Family of Novel Interleaved DC/DC Converters for Low-Voltage High-Current VoltageRegulator Module Applications," IEEE Power Electronics Specialists Conference, Jun. 2001, pp. 1507-1511, IEEE, Los Alamitos, CA.

Yan, L., et al., "Integrated Magnetic Full Wave Converter with Flexible Output Inductor," IEEE Transactions on Power Electronics, Mar. 2003, pp. 670-678, vol. 18, No. 2, IEEE, Los Alamitos, CA.

Yan, L., et al., "Integrated Magnetic Full Wave Converter with Flexible Output Inductor," 17th Annual Applied Power Electronics Conference and Exposition (APEC), 2002, pp. 824-830, vol. 2, IEEE, Dallas, TX.

Zhou, X., et al., "A High Power Density, High Efficiency and Fast Transient Voltage Regulator Module with a Novel Current Sensing and Current Sharing Technique," IEEE Applied Power Electronics Conference, Mar. 1999, pp. 289-294, IEEE, Los Alamitos, CA.

Zhou, X., et al., "Investigation of Candidate VRM Topologies for Future Microprocessors," IEEE Applied Power Electronics Conference, Mar. 1998, pp. 145-150; IEEE, Los Alamitos, CA.

Peng, C., et al., "A New Efficient High Frequency Rectifier Circuit," Proceedings of 1991 High Frequency Power Conversion (HFPC '91)Conference, Jun. 1991, pp. 236-243, Toronto, CA.

Freescale Semiconductor, "56F8323 Evaluation Module User Manual, 56F8300 16-bit Digital Signal Controllers", MC56F8323EVMUM, Rev. 2, Jul. 2005 (72 pages).

* cited by examiner

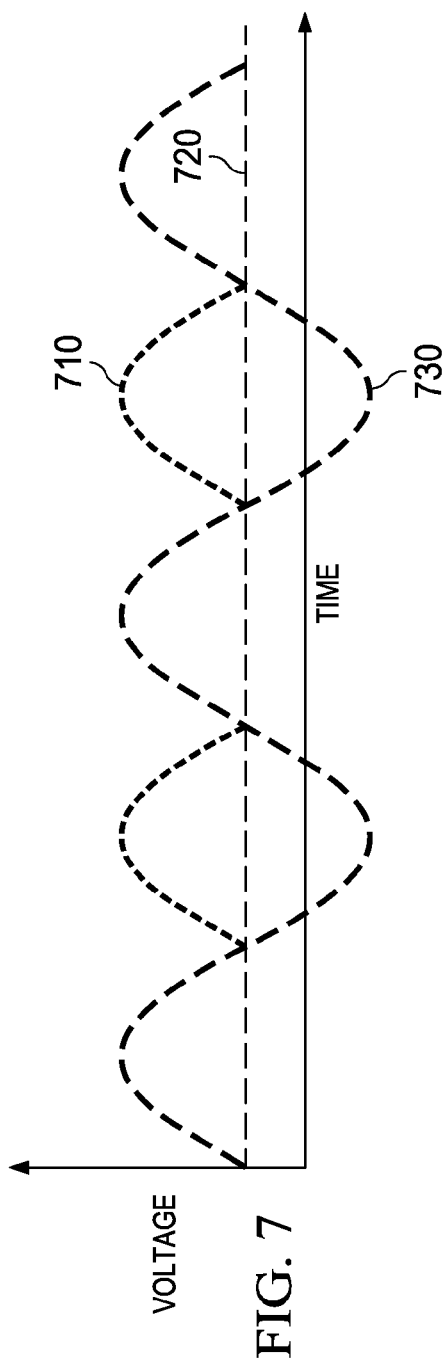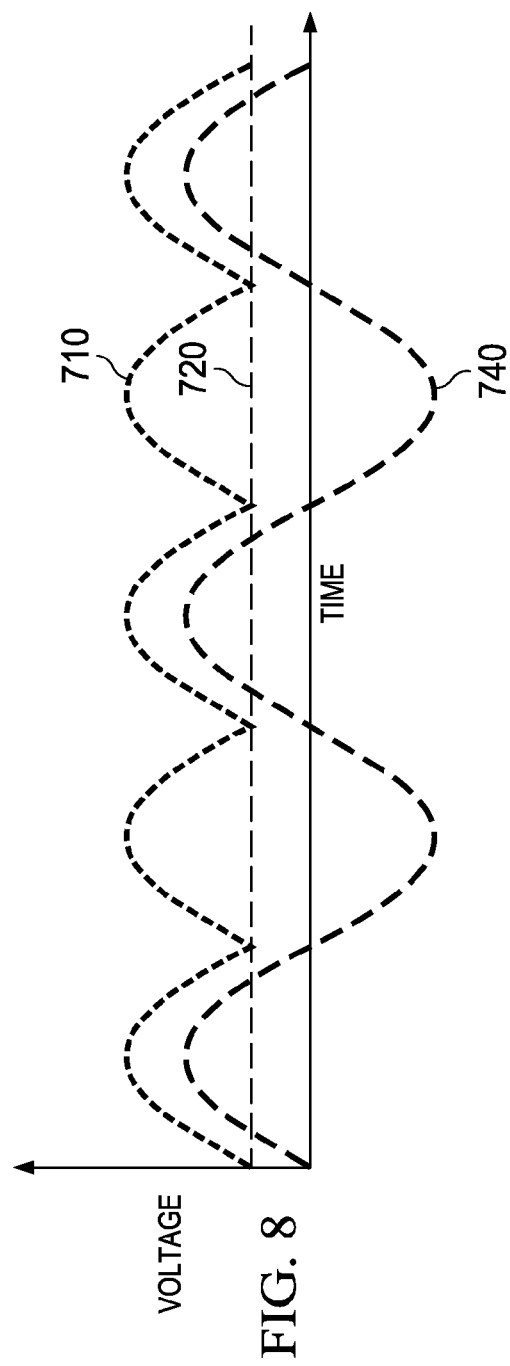

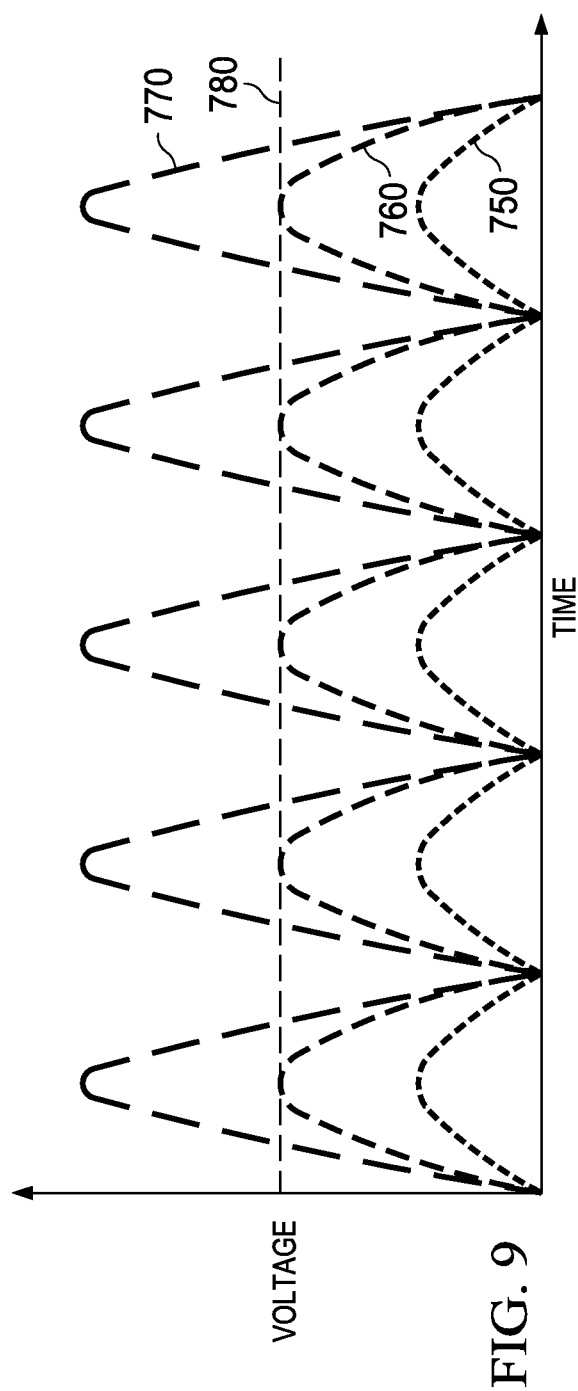

METHOD FOR ESTIMATING POWER OF A POWER CONVERTER

TECHNICAL FIELD

The present invention is directed, in general, to power electronics and, more specifically, to a controller for estimating a power of a power converter and method of estimating the same.

BACKGROUND

A switched-mode power converter (also referred to as a "power converter") is a power supply or power processing circuit that converts an input voltage waveform into a specified output voltage waveform. Alternating current to direct current ("ac-dc") power converters convert an ac input voltage into a dc output voltage. Controllers associated with the power converters manage an operation thereof by controlling conduction periods of power switches employed therein. Generally, the controllers are coupled between an input and output of the power converter in a feedback loop configuration (also referred to as a "control loop" or "closed control loop").

A common design requirement for a power converter is to estimate an input power accurately. Sensing and signal-conditioning circuits for a rectified sensed input voltage and current invariably produce a small, but significant dc offset (also referred to as an "offset" or a "bias"), which compromises the accuracy of an input power measurement. Calibration is a common approach for correcting dc offsets, but calibration adds a significant manufacturing cost, which is problematic in a high-volume, low-cost manufacturing environment.

Accordingly, what is needed in the art is a process for producing an accurate estimate of power in a power converter or other circuit and a related method that overcomes the deficiencies in the prior art.

SUMMARY OF THE INVENTION

These and other problems are generally solved or circumvented, and technical advantages are generally achieved, by advantageous embodiments of the present invention, including a controller for estimating a power of a power converter and method of estimating the same. In one embodiment, the controller includes an analog/digital converter configured to provide samples of a rectified voltage waveform corresponding to a rectified sensed voltage of the power converter. The controller also includes a processor configured to estimate a minimum value of the rectified voltage waveform in accordance with the samples and remove an offset from the rectified voltage waveform to obtain an unbiased rectified voltage waveform in accordance with the estimate of the minimum value. The controller is also configured to obtain an unbiased rectified current waveform corresponding to sensed current of the power converter and provide an average power of the power converter.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which:

FIGS. 7 to 9 illustrate graphical representations demonstrating other processes for providing an unbiased rectified voltage waveform, an unbiased rectified current waveform, an instantaneous power waveform and an average power in accordance with embodiments.

Corresponding numerals and symbols in the different FIGUREs generally refer to corresponding parts unless otherwise indicated, and may not be redescribed in the interest of brevity after the first instance. The FIGUREs are drawn to illustrate the relevant aspects of exemplary embodiments.

DETAILED DESCRIPTION OF ILLUSTRATIVE EMBODIMENTS

Figure 1:
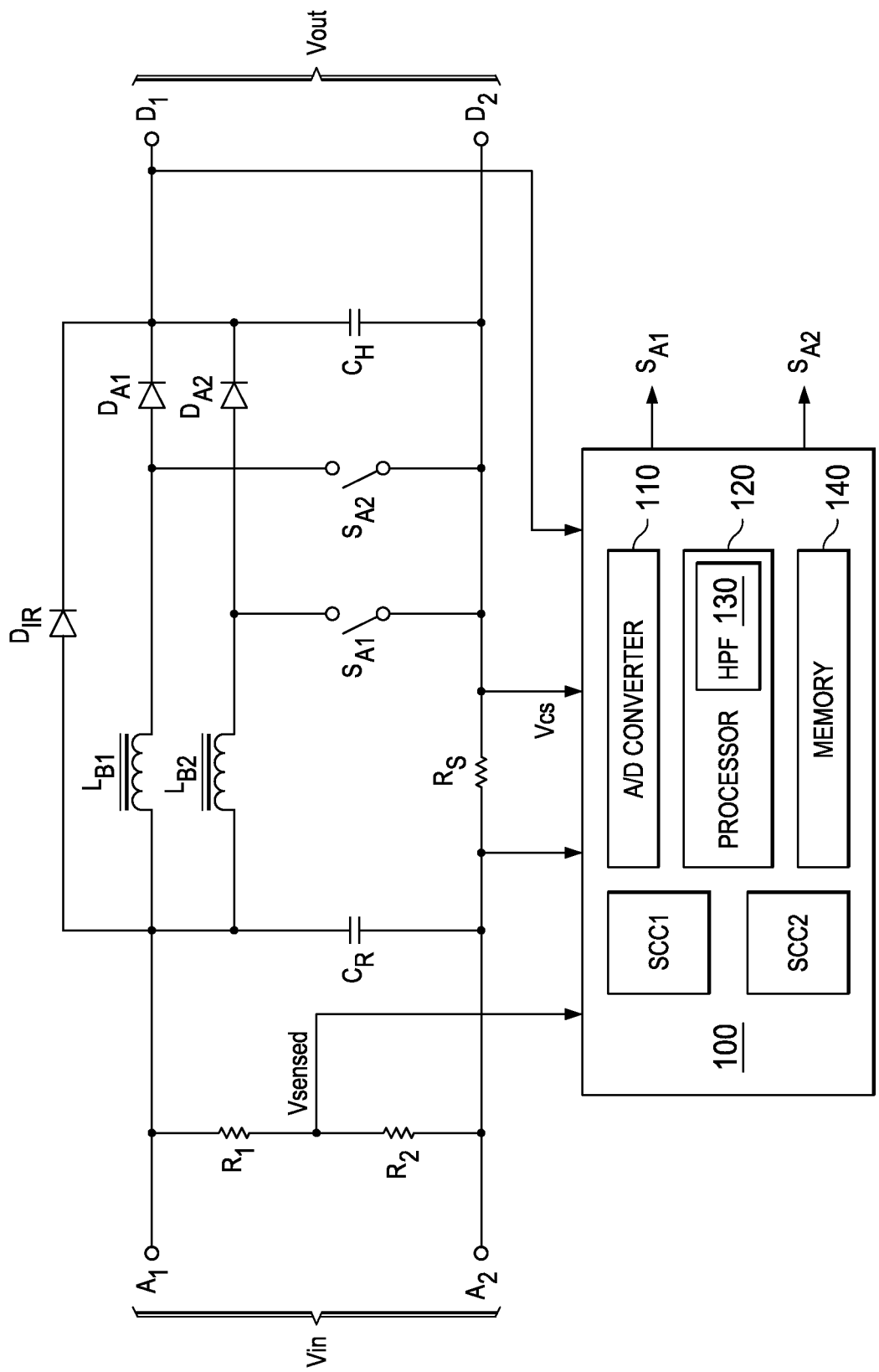
FIG. 1 illustrates a schematic diagram of a switched-mode power converter constructed in accordance with an embodiment.

The making and using of the present exemplary embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Exemplary embodiments will be described with respect to a specific context, namely, a controller for estimating a power (e.g., an input power) of a power converter and method of estimating the same. While the principles of the present invention will be described in the environment of a power converter, any application that may benefit from an estimate of power such as, without limitation, a power amplifier, a motor controller, or data processing equipment is well within the broad scope of the present invention.

Measurement of ac input power to an apparatus such as a power converter is a frequent design requirement. Alternating current input power is dependent on a product of an input voltage and current of a power converter. In an implementation of a controller for a power converter using digital techniques, input voltages and currents are typically sensed, conditioned, sampled, and processed in a processor (e.g., a digital signal controller ("DSC")). In practice, sensing and signal-conditioning circuits invariably produce a small, but significant dc offset for a rectified sensed signal such as a voltage or a current, which compromises the accuracy of rectified sensed voltage and current and produces a resulting inaccuracy in an input power measurement. The rectified sensed signal is also subject to electronic noise, drift due to ambient temperature variations and aging of components, and even variations in the operating environment of the power converter.

As mentioned previously, calibration is a common approach for estimating dc offsets, and can be performed in conjunction with accurately measuring an ac voltage applied to a power converter. Actual voltage, current, and internal power signals are read on calibrated instruments and recorded. Voltage and current offsets are recorded for various operating conditions under varying loads and input voltages. The recorded data are processed and analyzed for estimation of offset values, which estimated values are then subtracted from the sampled voltages and currents. In this manner, dc offsets are reduced, but not eliminated. Although calibration can reduce an offset, calibration adds manufacturing and maintenance costs and leaves remaining inaccuracies due to thermal drift, aging and environmental variations.

A process for estimating ac input power includes scaling down and conditioning an input voltage and total inductor current on an individual signal conditioning circuit ("SCC"). Voltages and currents are generally simultaneously sampled and digitized by an analog-to-digital ("A/D") converter. The sampled signals are multiplied together to produce instantaneous power at the sampling times. Instantaneous power is averaged such as by using the equation:

$$P_{IN} = \frac{1}{N}\sum_{n=1}^{N} v(n)I(n),$$

wherein, v(n) and i(n) are instantaneous voltage and current samples,

N represents the number of samples in a full cycle (which can be approximated by integrating over a half cycle), and $P_{IN}$ is an estimate of an input power, which is affected due to the presence of offsets in the voltages and currents.

A signal-conditioning circuit may include a low-pass filter, typically a first-order or a second-order resistor-capacitor filter, for anti-aliasing before an analog signal is digitized by an analog-to-digital converter. With full-wave rectification of a voltage and/or a current signal, an output of such a low-pass filter is expected to have a residual dc component which becomes part of the filtered signal and which appears as a dc offset. When the cut-off frequency of the filter is significantly higher than the ac line frequency, for example a few hundreds of times higher, the effect of the resulting dc component is negligible. Otherwise, the dc component which results (e.g., from an anti-aliasing filter) should be differentiated from the dc offset to be eliminated. Differentiation is accomplished by a digital signal processing process that reconstructs the original rectified voltage and current signals using a DSC.

The general procedure can be described as follows. In the complex frequency domain "s," a relationship between input and output of an anti-aliasing filter can be written as:

$$Y(s)=X(s)\cdot H(s),$$

where "s" denotes complex frequency, X(s) is the Laplace transform of the anti-aliasing filter input signal, Y(s) is the Laplace transform of the anti-aliasing filter output signal, and H(s) is the s-domain transfer function of anti-aliasing filter. Due to digitization of the continuous-time output signal y(t) corresponding to the Laplace transform of the anti-aliasing filter output signal Y(s) into a discrete-time signal $y(nT_s)$ by an analog-to-digital converter with a sampling interval $T_s$ and to the known transfer function of the filter formed (e.g., with a resistor-capacitor network), the original discrete-time input signal $x(nT_s)$ can then be reconstructed. In the discrete-time Z-transform domain, the original input signal X(z) can be represented as, $$X(z) = \frac{Y(z)}{H(z)},$$

where, X(z) is the Z-transform of input signal to anti-aliasing filter, Y(z) is the Z-transform of output signal out of the anti-aliasing filter, and H(z) is the Z-transform of transfer function of anti-aliasing filter.

The transfer function H(z) can be derived as a bilinear transform as, $$H(z) = H(s)\bigg|_{s=\frac{2(1-z^{-1})}{T_s(1+z^{-1})}}.$$

As a consequence, the original discrete-time signal $x(nT_s)$, or x(n) for simplicity, can be obtained in terms of an inverse Z-transform, $$x(n)=Z^{-1}[X(z)].$$

where x(n) represents a discretized, instantaneous voltage v(n) or current i(n) sampled prior to heavy filtering.

A signal processing approach is introduced herein to substantially remove the offset from a sampled signal. The sampled signal with the offset removed is used to estimate ac input power with better accuracy. The process may execute a software-based solution without the need for added components, and can improve digital measurement accuracy for ac input power without incrementing a bill-of-material or a build cost for its implementation. A calibration process that searches offsets under various operating conditions is considerably simplified. The result is improved productivity and reduced cost in a mass-production operation.

As introduced herein, a controller including a processor (such as a digital signal controller or a microprocessor control unit ("MCU")) is configured to make an accurate measurement of ac input power in a power converter or other circuit. The process can be applied, without limitation, to multiphase interleaving operation of a switched-mode power converter or to the front end of a single-phase, stand-alone, power factor correction ("PFC") switched-mode power converter.

A rectified ac voltage with an offset is sampled by an A/D converter to produce a digitized sampled signal, and the digitized sampled signal is fed to a processor. The digitized sampled signal is employed to reconstruct a complete ac signal. An averaged total inductor current, also with an offset, is also digitally sampled. Since the input ac current is substantially in phase with the ac input voltage for a properly designed power-factor correction power converter, a digitized total inductor current can be constructed as an ac signal as well, based on relevant ac input voltage information. Both synthesized ac signals are respectively processed by the processor using, for instance, digital high-pass filters to remove the respective dc offsets. At this stage, individual offsets are substantially eliminated. The resultant, reconstructed ac signals are then used to calculate input power with improved accuracy.

Turning now to FIG. 1, illustrated is a schematic diagram of a switched-mode power converter (e.g., an interleaved boost power converter) constructed in accordance with an embodiment. An ac input voltage is applied to power converter input terminals, which is rectified by a full-wave diode-bridge, not shown, to produce a rectified ac input voltage (also referred to as a "rectified input voltage") Vin for the interleaved boost power converter. The rectified input voltage Vin is applied to input terminals $A_1$, $A_2$ of a power train including two interleaved and paralleled boost power converter subcircuits (power conversion circuitry) for achieving power factor correction.

A first boost power converter subcircuit is formed with an input inductor $L_{B1}$, a power switch $S_{A1}$, and a boost diode $D_{A1}$. A second boost power converter subcircuit is formed with an input inductor $L_{B2}$, a power switch $S_{A2}$, and a boost diode $D_{A2}$. The power switches $S_{A1}$, $S_{A2}$ can be n-channel metal-oxide semiconductor field-effect transistors ("MOSFETs") that are each controlled to conduct intermittently and out of phase with a duty cycle D to produce inductor currents in the boost inductors $L_{B1}$, $L_{B2}$. The inductor currents in the boost inductors $L_{B1}$, $L_{B2}$ are conducted to the boost diodes $D_{A1}$, $D_{A2}$, each with a complementary duty cycle 1-D. The output currents of the first and second boost power converter subcircuits are coupled to an output filter capacitor $C_H$. The boost diodes $D_{A1}$, $D_{A2}$ rectify the respective inductor currents to produce a dc output voltage Vout across the output filter capacitor $C_H$. A diode $D_{IR}$ is an in-rush diode that prevents the output filter capacitor $C_H$ from being overcharged upon turn-on of the interleaved boost power converter. A capacitor $C_R$ is an input filter capacitor. A pair of terminals $D_1$, $D_2$ are the output terminals of the interleaved boost power converter.

The rectified input voltage Vin is sensed and scaled down with a voltage divider formed with resistors $R_1$, $R_2$, and a rectified sensed signal (e.g., a rectified sensed input voltage, also referred to as a "rectified sensed voltage" Vsensed) is coupled to a first signal conditioning circuit SCC1 which includes a low-pass filter for anti-alias filtering and for eliminating high-frequency noise to produce a conditioned signal representative of the rectified input voltage Vin. A sensing and conditioning offset is now present in the rectified sensed voltage Vsensed. The rectified, sensed, and conditioned voltage Vsensed can also be obtained by scaling down the ac input voltage and rectifying it with an additional diode bridge, and by feeding the scaled and rectified signal to a signal conditioning circuit.

The input current is sensed with a sense resistor $R_S$, and a rectified current sense voltage $V_{CS}$ produced thereby is coupled to a second signal conditioning circuit SCC2, which also includes a low-pass filter for anti-alias filtering and for eliminating high-frequency noise to produce a signal representative of the input current. In an alternative embodiment, the input current is sensed with a current-sense transformer, with the same offset result.

The interleaved boost power converter also includes a controller 100 including the first and second signal conditioning circuits SCC1, SCC2, an A/D converter 110, a processor 120 and memory 140. The processor 120 also includes a high-pass filter ("HPF") 130. The inputs to the controller 100 include the input current sensed with a sense resistor $R_S$, the rectified sensed voltage Vsensed and the output voltage Vout. The controller employs the output voltage Vout to regulate the same by controlling the conduction of the power switches $S_{A1}$, $S_{A2}$. Those skilled in the art should understand that the controller 100 (and its respective components) may include other subsystems and circuits to control the operation of the interleaved boost power converter.

Figure 2:
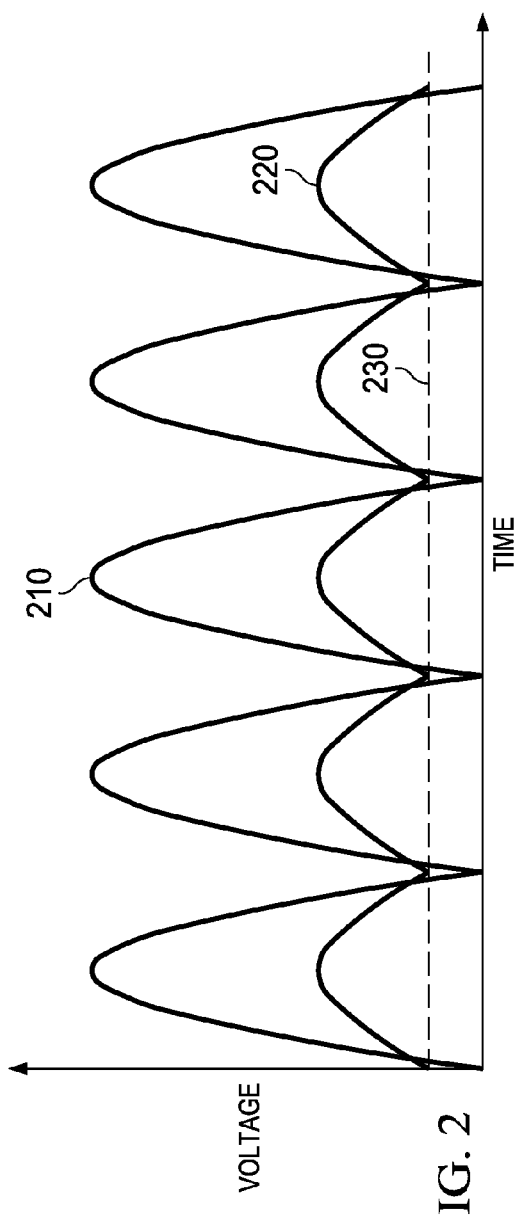
FIG. 2 illustrates a graphical representation of representative parameters of the switched-mode power converter illustrated in FIG. 1.

Turning now to FIG. 2, illustrated is a graphical representation of representative parameters of the switched-mode power converter illustrated in FIG. 1. In particular, FIG. 2 illustrates a waveform 210 of the rectified input voltage Vin applied to the interleaved boost power converter illustrated in FIG. 1, and a corresponding waveform (a rectified voltage waveform 220) of the rectified sensed voltage Vsensed produced by the A/D converter 110 and stored in the memory 140 of the controller 100. FIG. 2 also illustrates the offset 230 present in the rectified sensed voltage Vsensed.

Figure 3:
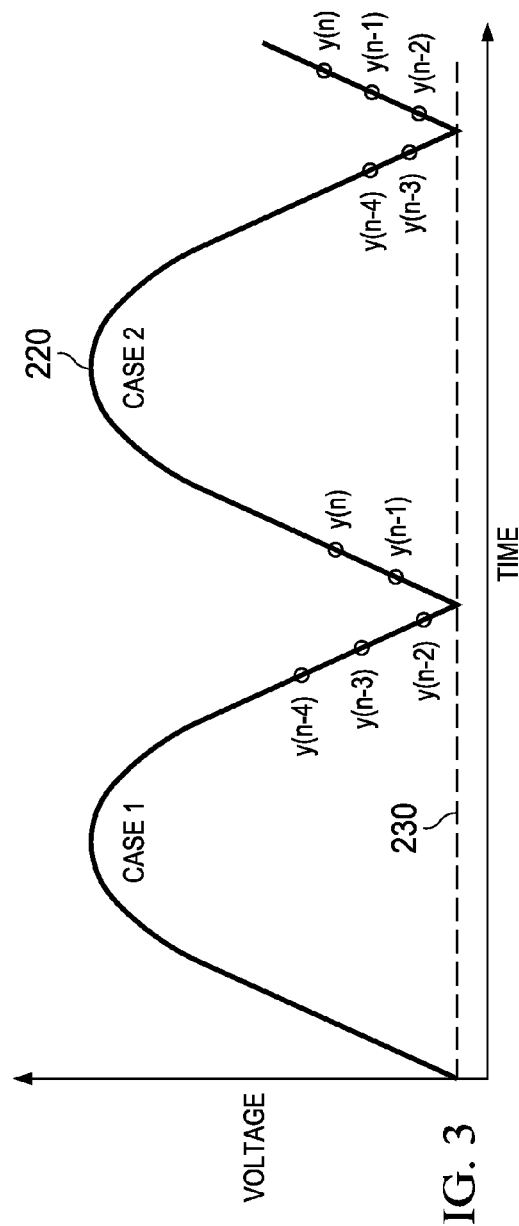
FIG. 3 illustrates a graphical representation of a process to estimate an offset of the rectified voltage waveform of FIG. 2.

Turning now to FIG. 3, illustrated is a graphical representation of a process to estimate the offset 230 of the rectified voltage waveform 220 (corresponding to a rectified sensed voltage Vsensed) of FIG. 2. With continuing reference to FIG. 1, the controller (e.g., a programmable digital control unit) 100 starts with a minimal-value searching process executed (e.g., by a firmware code—or an integrated circuit—("IC") based hardware implementation) to determine a minimum value of the rectified voltage waveform 220 of the rectified sensed voltage Vsensed.

If the analog signal to the A/D converter input channel is noisy, the minimum-value searching process can be performed employing a comparison of sampled data over a half line cycle or a whole line cycle. In order to ensure desired measurement accuracy, the sampling rate should be sufficiently high. If the sampled signal series or the analog signal to the A/D converter input channel is clean with no higher frequency spike than the line frequency, then the minimum-value searching process can be performed employing a comparison or a first-derivative detection process. The minimum value of the rectified voltage waveform 220 is located at a slope discontinuity over at least a half cycle thereof. In the comparison process, the controller 100 (via, for instance, an A/D converter 110) samples and compares each sample to one another in a half cycle to estimate the minimal value of the rectified voltage waveform 220. Letting y(n) represent a sample of the rectified voltage waveform 220 at sample point n, if y(1)>y(2), a minimum value of the rectified voltage waveform 220 is taken as sample y(2). If y(2)>y(3), then the minimum value of the rectified voltage waveform 220 is taken as sample y(3), else the minimum value of the rectified voltage waveform 220 is taken as sample y(2). Thus, in the first case (designated "Case 1"), the sample y(n−2) lies on the left-hand side of the minimum value of the rectified voltage waveform 220. Although this sample value is the closest one to the minimum value of the rectified voltage waveform 220, there still is an apparent difference with the minimum value thereof. In the second case (designated "Case 2"), the sample y(n−2) lies on the right-hand side of the minimum value of the rectified voltage waveform 220. Again, an apparent error in finding the minimum value of the rectified voltage waveform 220 remains. In order to find the minimum value of the rectified voltage waveform 220 with reasonable accuracy, the sampling rate should be sufficiently high, and the sample size should be sufficiently large.

For an improved low cost, high-accuracy solution, the rectified voltage waveform 220 is sampled at a lower rate, which would ordinarily introduce substantial error in identifying a minimum value thereof. The improved solution employs linear interpolation of the samples of the rectified voltage waveform 220 to make a better estimate of the minimum value thereof.

Figure 4:
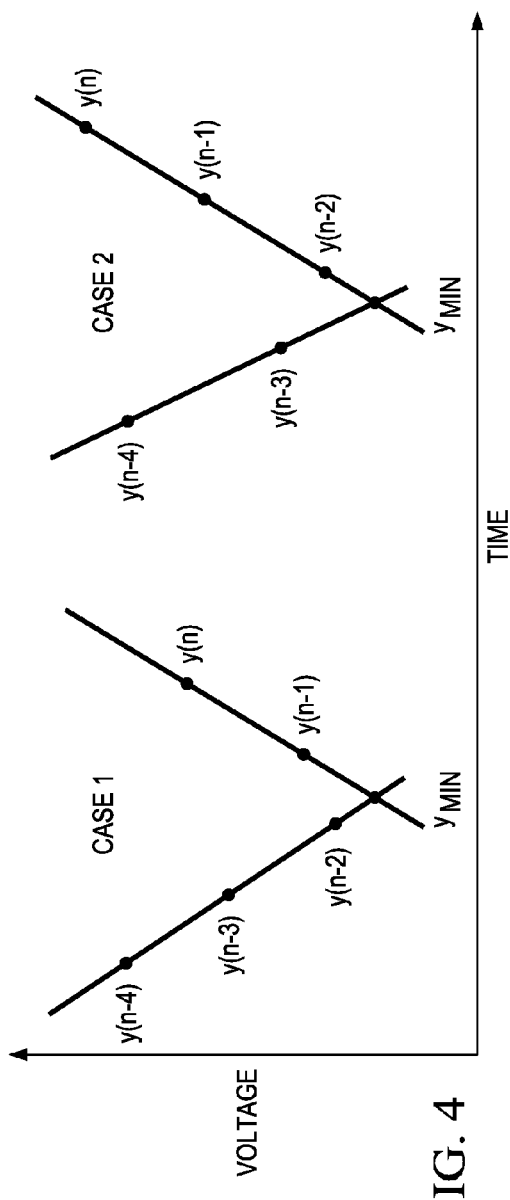
FIG. 4 illustrates a graphical representation of a process to estimate a minimum value of the rectified voltage waveform of FIG. 2 employing linear interpolation of samples of the rectified voltage waveform in accordance with an embodiment.

Turning now to FIG. 4, illustrated is a graphical representation of a process to estimate the minimum value of the rectified voltage waveform 220 of FIG. 2 employing linear interpolation of samples of the rectified voltage waveform 220 in accordance with an embodiment. With continuing reference to FIG. 1, the rectified voltage waveform 220 is sampled to produce a sequence of samples or sample values y(1), y(2), . . . y(n−1) and y(n). The present sample y(n) and its previous four sample values y(n−1), y(n−2), y(n−3) and y(n−4) are retained. If (y(n−3)>y(n−2) and if y(n−2)<y(n−1), then the minimum value of the rectified voltage waveform 220 lies between samples y(n−1) and y(n−2). Employing linearization for the rectified voltage waveform 220 in the vicinity of its minimum value (designated "$y_{MIN}$"), it is assumed for the first case (designated "Case 1") that a straight line through the samples y(n−4), y(n−3), y(n−2) and $y_{MIN}$ have an opposite slope as a straight line through the sample points y(n), y(n−1) and $y_{MIN}$. In the second case (designated "Case 2"), it is assumed that a straight line through the sample points y(n−4), y(n−3) and $y_{MIN}$ have an opposite slope as a straight line through the sample points y(n), y(n−1), y(n−2) and $y_{MIN}$. In either case, the sample y(n−2) is not needed to estimate the minimum value assuming the linear slopes. In either case, the minimum value of the rectified voltage waveform 220 can be estimated with good accuracy. Several minimum values that are obtained over several half cycles of an input voltage Vin can also be passed through a low-pass filter for averaging and noise rejection.

Figure 5:
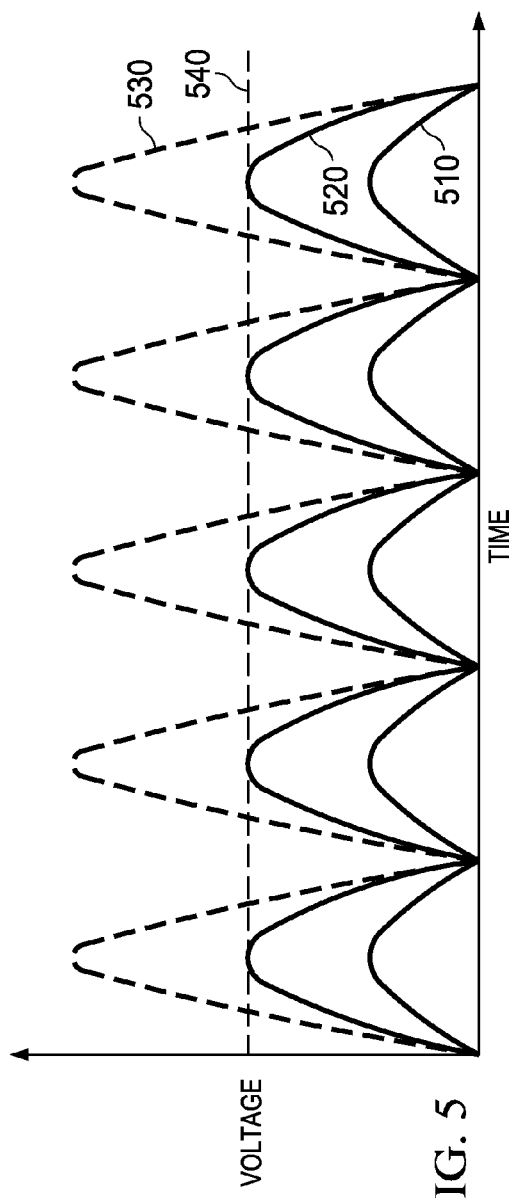
FIG. 5 illustrates a graphical representation of an unbiased rectified voltage waveform, an unbiased rectified current waveform, an instantaneous power waveform and an average power in accordance with an embodiment.

Turning now to FIG. 5, illustrated is a graphical representation of an unbiased rectified voltage waveform, an unbiased rectified current waveform, an instantaneous power waveform and an average power in accordance with an embodiment. With continuing reference to the preceding FIGUREs, the unbiased rectified voltage waveform 510 (corresponding to an unbiased rectified sensed voltage V'sensed) is determined by subtracting the estimated minimum value $y_{MIN}$ (determined above) from the rectified voltage waveform 220 (corresponding to the rectified sensed voltage Vsensed) thereby removing the offset therefrom.

As mentioned above with respect to FIG. 1, a rectified current sense voltage $V_{CS}$ is sensed with a sense resistor $R_S$ and provided to the second signal conditioning circuit SCC2 of the controller 100. In a process analogous to the process described above with respect to the rectified voltage waveform 220 (corresponding to the rectified sensed voltage Vsensed), another rectified voltage waveform corresponding to the rectified current sense voltage $V_{CS}$ is processed to remove an offset therefrom. Once a minimum value (another minimum value) of the another rectified voltage waveform is determined, an unbiased another voltage waveform (corresponding to an unbiased rectified current sense voltage $V'_{CS}$) is determined by subtracting the estimated another minimum value from the another rectified voltage waveform (corresponding to the rectified current sense voltage $V_{CS}$) thereby removing the offset therefrom. Thereafter, a scaling factor is applied to the unbiased another rectified voltage waveform to determine an unbiased rectified current waveform 520. An instantaneous power (illustrated as an instantaneous power waveform 530) is determined by multiplying the unbiased rectified voltage waveform 510 and the unbiased rectified current waveform 520. An average of the instantaneous power waveform 530 provides an average power 540.

Figure 6:
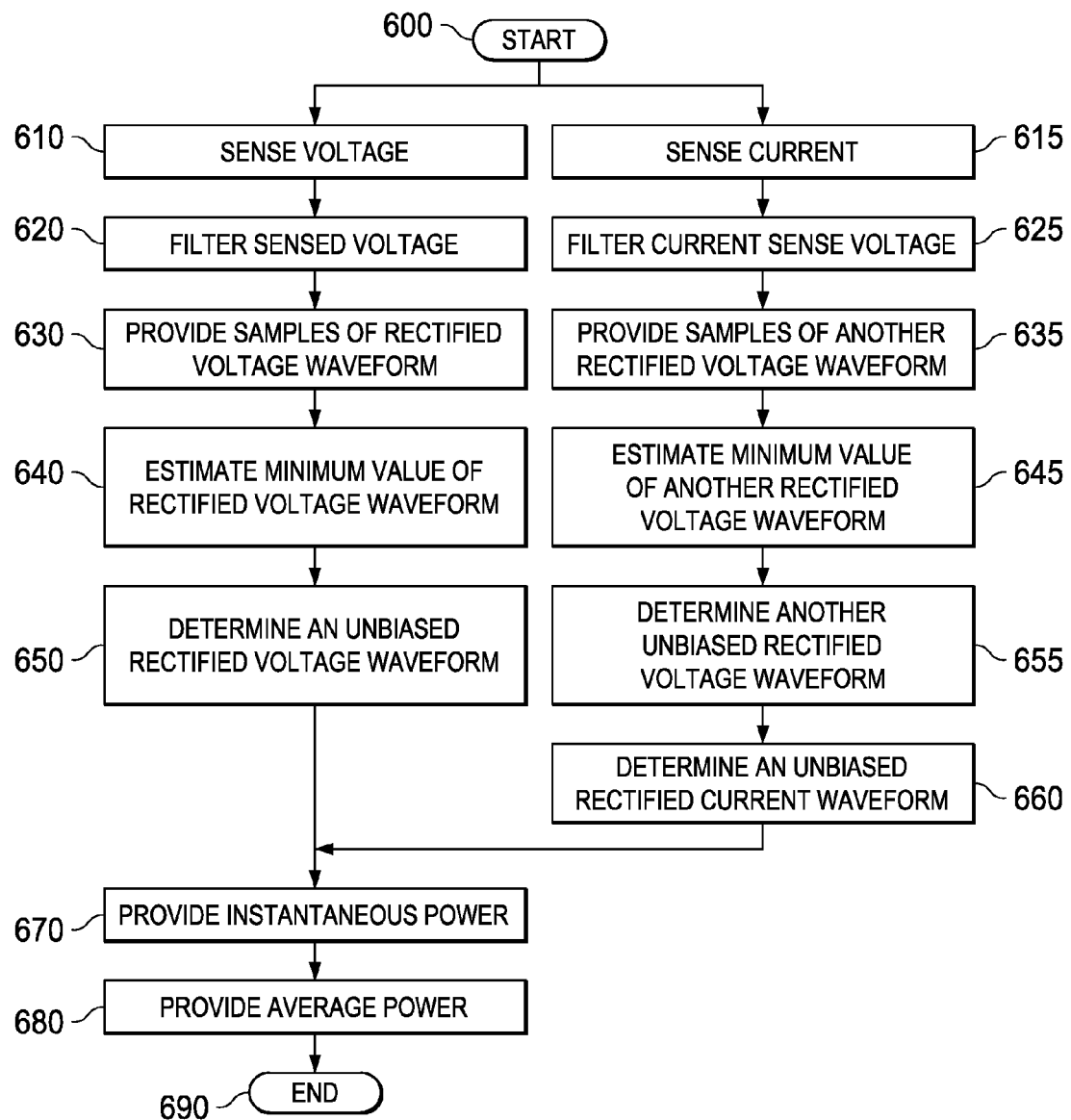
FIG. 6 illustrates a flow diagram of a method of estimating power of a power converter according to an embodiment.

Turning now to FIG. 6, illustrated is a flow diagram of a method of estimating power (e.g., an input power) of a power converter according to an embodiment. The method begins in a start module 600. A voltage (e.g., a rectified sensed voltage) of the power converter is sensed in a module 610 and a current of the power converter is sensed in a module 615. The current of the power converter may be sensed with a sense resistor and a rectified current sense voltage is produced therefrom. The respective voltages (e.g., the rectified sensed voltage and the rectified current sense voltage) are filtered (via, for instance, a signal conditioning circuit) in modules 620, 625, respectively. In a module 630, the method provides samples of a rectified voltage waveform corresponding to the rectified sensed voltage via, for instance, an A/D converter. In a module 635, the method provides samples of another rectified voltage waveform corresponding to the rectified current sense voltage via, for instance, an A/D converter.

Thereafter, a linear interpolation of the rectified voltage waveform and the another rectified voltage waveform is performed via, for instance, a processor, to estimate of a minimum value of the rectified voltage waveform and the another rectified voltage waveform in modules, 640, 645, respectively. In a module 650, an unbiased rectified voltage waveform (corresponding to an unbiased rectified sensed voltage) is determined by subtracting the estimated minimum value from the rectified voltage waveform (corresponding to the rectified sensed voltage) via, for instance, a processor, thereby removing the offset therefrom. In a module 655, another unbiased rectified voltage waveform (corresponding to an unbiased rectified current sense voltage) is determined by subtracting an estimated minimum value from the another rectified voltage waveform (corresponding to the rectified current sense voltage) via, for instance, a processor, thereby removing the offset therefrom.

In a module 660, a scaling factor is applied to the another unbiased rectified voltage waveform to provide an unbiased rectified current waveform via, for instance, a processor. The method continues by multiplying the unbiased rectified voltage waveform by the unbiased rectified current waveform to provide an instantaneous power via, for instance, a processor in a module 670. In a module 680, an average of the instantaneous power is calculated to provide an average power via, for instance, a processor. The method, thereafter, is complete in an end module 690.

Turning now to FIGS. 7 to 9, illustrated are graphical representations demonstrating other processes for providing an unbiased rectified voltage waveform, an unbiased rectified current waveform, an instantaneous power waveform and an average power in accordance with embodiments. Beginning with FIG. 7, a rectified voltage waveform 710 (corresponding, for instance, to the rectified sensed voltage Vsensed of FIG. 1 and samples of which are denoted as y(n)) and with an offset 720 is restructured to obtain a reconstructed voltage waveform 730 (samples of which are denoted as z(n)). As shown in FIG. 8 and described in more detail below, an unbiased reconstructed voltage waveform 740 (samples of which are denoted as z'(n)) is obtained from the rectified voltage waveform 710. It should be noted that $y_{MIN}$ is an estimate of the minimum value of the rectified voltage waveform 710 corresponding to the offset 720. The estimate of the minimum value of the rectified voltage waveform 710 may be determined as described above with respect to FIG. 4.

In a positive half cycle, (y(n)−$y_{MIN}$)≥0, and the reconstructed voltage waveform 730 is given by the equation:

$$z(n)=y(n),$$

and the unbiased reconstructed voltage waveform 740 is given by the equation:

$$z'(n)=y(n)-y_{MIN}.$$

In a negative half cycle, $(y(n)-y_{MIN})=(y_{MIN}-z(n))$. Accordingly, in a negative half cycle, the reconstructed voltage waveform 730 is given by the equation:

$$z(n)=2*y_{MIN}-y(n),$$

and the unbiased reconstructed voltage waveform 740 is given by the equation:

$$z'(n)=y_{MIN}-y(n).$$

These logical and arithmetic operations can be implemented in a processor 120 using a digital process.

Alternatively and with continuing reference to FIG. 1, the reconstructed voltage waveform 730 can be applied to a high-pass filter 130 to remove the offset 720. A high-pass filter 130 can be readily implemented with a digital process on a processor 120 (e.g., a digital signal processor). The high-pass filter 130 that allows high-frequency signal components to pass through and blocks a dc offset and low-frequency components can be employed to obtain the unbiased reconstructed voltage waveform 740. The high-pass filter 130 can be implemented in a processor 120 via software with a programmable digital control unit or with specific hardware employing an integrated circuit.

A digital high-pass filter 130 can be constructed employing the equation:

$$z'_i = \alpha \cdot z'_{i-1} + \beta \cdot (z_i - z_{i-1}),$$

where $z_i$ and $z_{i-1}$ represent a sequence of samples in time of the reconstructed voltage waveform 730 with the offset 720, and $z'_i$ and $z'_{i-1}$ represent a corresponding sequence of computed values of the unbiased reconstructed voltage waveform 740 with the offset 720 removed. The coefficients $\alpha$ and $\beta$ are generally constants, $0<\alpha<1$, and $0<\beta$, e.g., $\alpha=0.999$ and $\beta=1$ for samples spaced one millisecond apart. The result of application of the equation above to the reconstructed voltage waveform 730 is to progressively remove the offset 720 a number of waveform cycles. It should be understood that while the two processes described with respect to FIGS. 7 and 8 (i.e., with or without the use of the high-pass filter 130) provide an unbiased reconstructed voltage waveform 740, the numerical values thereof may be a different.

Turning to FIG. 9, after the obtaining the unbiased reconstructed voltage waveform 740 using either process above, the unbiased rectified voltage waveform 750 is determined. The unbiased rectified voltage waveform 750 is established by reversing the sign of negative digital samples of the unbiased reconstructed voltage waveform 740. In a process analogous to the process described above with respect to the rectified voltage waveform 710 (corresponding to the rectified sensed voltage Vsensed), another rectified voltage waveform corresponding to a rectified current sense voltage $V_{CS}$ (e.g., a sensed current across the sense resistor $R_s$ of FIG. 1) may be processed to remove an offset therefrom to obtain another unbiased rectified voltage waveform. Once the offset is removed, a scaling factor can be applied to the another unbiased rectified voltage waveform to obtain an unbiased rectified current waveform 760. An instantaneous power (illustrated as an instantaneous power waveform 770) is determined by multiplying the unbiased rectified voltage waveform 750 and the unbiased rectified current waveform 760. An average of the instantaneous power waveform 770 provides an average power 780.

The process to produce the unbiased rectified current waveform 760 can be simplified employing the assumption that the current waveform is in phase with its voltage counterpart due to the property of high power factor produced by a controller 100 for the power converter. This assumption simplifies a search for a minimal point in a half line cycle for the another rectified voltage waveform corresponding to a rectified current sense voltage $V_{CS}$ (e.g., a sensed current across the sense resistor $R_s$) because the minimum sample value corresponds closely in time to the minimum sample value of the rectified voltage waveform 710 (corresponding to the rectified sensed voltage Vsensed of FIG. 1). The timing of the minimum sample value of the rectified voltage waveform 710 can be taken at least as a starting value in a search for the minimum sample value of the another rectified voltage waveform corresponding to a rectified current sense voltage $V_{CS}$ in a half line cycle of the input voltage Vin of the power converter.

Figure 10:
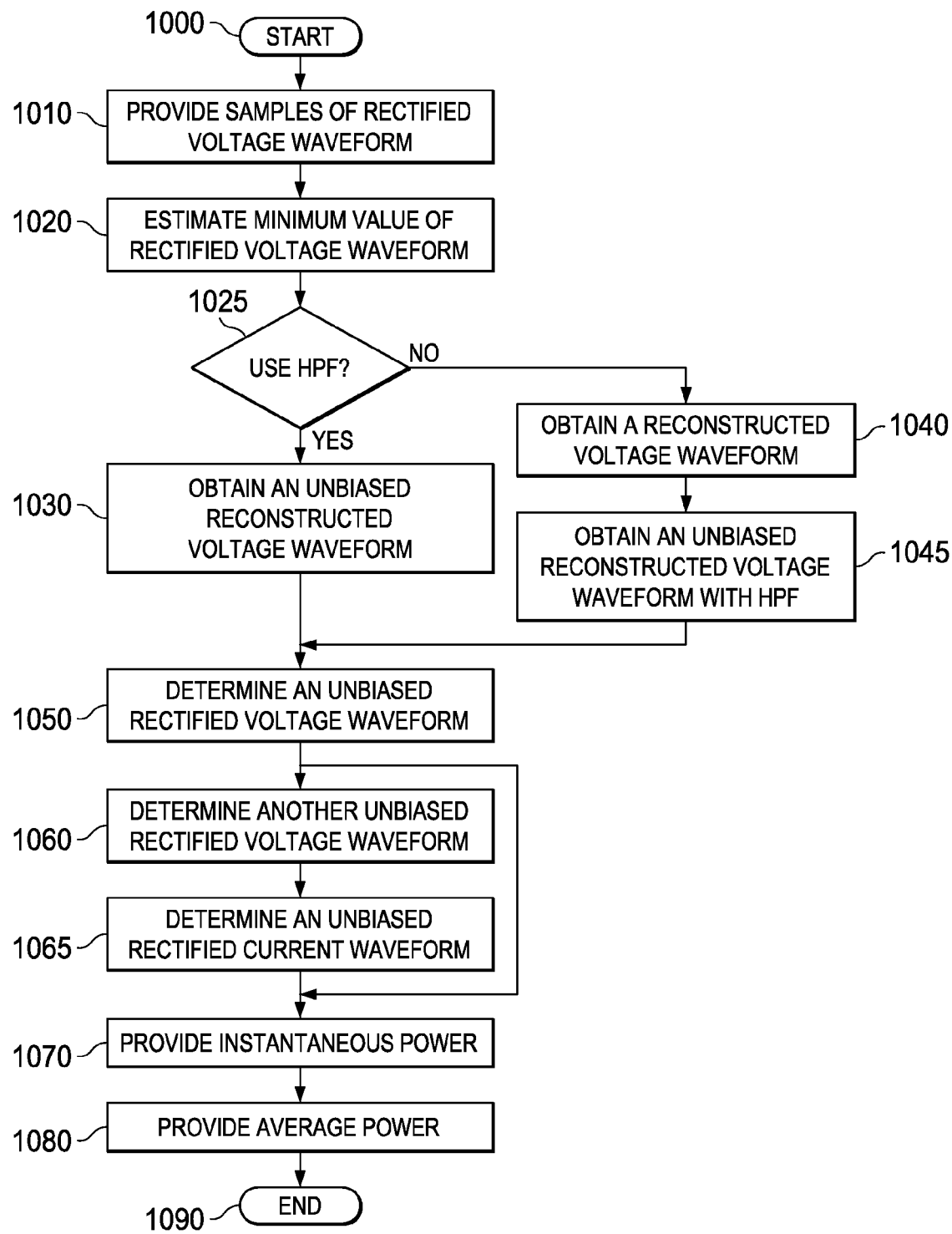
FIG. 10 illustrated is a flow diagram of another method of estimating power of a power converter according to an embodiment.

Turning now to FIG. 10, illustrated is a flow diagram of another method of estimating power (e.g., an input power) of a power converter according to an embodiment. The method that follows will describe determining an unbiased rectified voltage waveform, which may pertain to the rectified sensed voltage Vsensed and/or the rectified current sense voltage Vcs introduced with respect to FIG. 1. The method that follows assumes that a rectified voltage waveform (with an offset) has been sensed and filtered and, thereafter, begins in a start module 1000. In a module 1010, the method provides samples of a rectified voltage waveform via, for instance, an A/D converter.

Thereafter, a linear interpolation of the rectified voltage waveform is performed via, for instance, a processor, to estimate of a minimum value of the rectified voltage waveform in a module 1020. In a decisional module 1025, it is determined if the method will employ a high pass filter ("HPF") of, for instance, a processor. If the method does not employ a high pass filter, the method continues to a module 1030 wherein an unbiased reconstructed voltage waveform (without the offset) is determined from the rectified voltage waveform employing the estimate of the minimum value via, for instance, a processor.

If the method employs a high pass filter, the method continues to a module 1040 wherein the rectified voltage waveform is then restructured via, for instance, a processor into a reconstructed voltage waveform in a module 1040. The reconstructed voltage waveform can then passed through the high pass filter to obtain the unbiased reconstructed voltage waveform in a module 1045. As mentioned above, it should be understood that while the two processes described with respect to FIG. 10 (i.e., with or without the use of the high-pass filter) provide an unbiased reconstructed voltage waveform, the numerical values thereof may be a different. Then, an unbiased rectified voltage waveform is established via, for instance, the processor by reversing the sign of negative digital samples of the unbiased reconstructed voltage waveform in a module 1050.

The modules 1010 to 1050 can be repeated on another rectified waveform corresponding to the rectified current sense voltage Vcs introduced with respect to FIG. 1 to obtain another unbiased reconstructed voltage waveform in a module 1060. In a module 1065, a scaling factor is applied to the another unbiased rectified voltage waveform to provide an unbiased rectified current waveform via, for instance, a processor. The method continues by multiplying the unbiased rectified voltage waveform by the unbiased rectified current waveform to provide an instantaneous power via, for instance, a processor in a module 1070. In a module 1080, an average of the instantaneous power is calculated to provide an average power via, for instance, a processor. The method, thereafter, is complete in an end module 1090.

Those skilled in the art should understand that the previously described embodiments of a power converter, controller, and related methods of operating the same are submitted for illustrative purposes only. In addition, various power converter topologies are well within the broad scope of the present invention. While the controller has been described in the environment of an interleaved boost power converter, it may also be applied to other systems such as, without limitation, a power amplifier and a motor controller.

For a better understanding of power converters, see "Modern DC-to-DC Power Switch-mode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). The aforementioned references are incorporated herein by reference in their entirety.

Program or code segments making up the various embodiments may be stored in a computer readable medium. For instance, a computer program product including a program code stored in a computer readable medium (e.g., a non-transitory computer readable medium) may form various embodiments. The "computer readable medium" may include any medium that can store or transfer information. Examples of the computer readable medium include an electronic circuit, a semiconductor memory device, a read only memory ("ROM"), a flash memory, an erasable ROM ("EROM"), a floppy diskette, a compact disk ("CD")-ROM, and the like.

As described above, the exemplary embodiment provides both a method and corresponding apparatus consisting of various modules providing functionality for performing the steps of the method. The modules may be implemented as hardware (embodied in one or more chips including an integrated circuit such as an application specific integrated circuit), or may be implemented as software or firmware for execution by a processor. In particular, in the case of firmware or software, the exemplary embodiment can be provided as a computer program product including a computer readable storage structure embodying computer program code (i.e., software or firmware) thereon for execution by the processor.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A controller, comprising:
   an analog/digital converter configured to provide samples of a first rectified voltage waveform and a second rectified voltage waveform; and
   a processor configured to:
      estimate a first minimum value of said first rectified voltage waveform and a second minimum value of said second rectified voltage waveform in accordance with said samples;
      remove a first offset from said first rectified voltage waveform and a second offset from said second rectified voltage waveform to obtain a first unbiased rectified voltage waveform in accordance with said estimate of said first minimum value and a second unbiased rectified voltage waveform in accordance with said estimate of said second minimum value;
      apply a scaling factor to said second unbiased rectified voltage waveform to determine an unbiased rectified current waveform;
      multiply said first unbiased rectified voltage waveform and said unbiased rectified current waveform to determine an instantaneous power; and
      provide an average of said instantaneous power to determine an average power.

2. The controller as recited in claim 1 wherein said processor is configured to estimate said first minimum value of said first rectified voltage waveform by employing a linear interpolation of said samples.

3. The controller as recited in claim 1, wherein
   said processor is configured to perform a minimum value searching process to estimate said first minimum value of said first rectified voltage waveform.

4. The controller as recited in claim 1 further comprising a filter configured to substantially eliminate high-frequency noise from said first rectified voltage waveform.

5. The controller as recited in claim 1 wherein said processor is configured to determine a first unbiased reconstructed voltage waveform from said first rectified voltage waveform employing said estimate of said first minimum value and determine said first unbiased rectified voltage waveform by reversing a sign of negative samples of said first unbiased reconstructed voltage waveform.

6. The controller as recited in claim 1 wherein said processor is configured to restructure said first rectified voltage waveform into a first reconstructed voltage waveform.

7. The controller as recited in claim 6 wherein said processor is configured to determine a first unbiased reconstructed voltage waveform from said first reconstructed voltage waveform employing a high pass filter and determine said first unbiased rectified voltage waveform by reversing a sign of negative samples of said first unbiased reconstructed voltage waveform.

8. A method, comprising:
   providing samples of a first rectified voltage waveform and a second rectified voltage waveform;
   estimating a first minimum value of said first rectified voltage waveform and a second minimum value of said second rectified voltage waveform in accordance with said samples;
   removing a first offset from said first rectified voltage waveform and a second offset from said second rectified voltage waveform to obtain a first unbiased rectified voltage waveform in accordance with said estimate of said first minimum value and a second unbiased rectified voltage waveform in accordance with said estimate of said second minimum value;
   applying a scaling factor to said second unbiased rectified voltage waveform to determine an unbiased rectified current waveform;

multiplying said first unbiased rectified voltage waveform and said unbiased rectified current waveform to determine an instantaneous power; and providing an average of said instantaneous power to determine an average power.

9. The method as recited in claim 8 further comprising employing a linear interpolation of said samples to estimate said first minimum value of said first rectified voltage waveform.

10. The method as recited in claim 8, further comprising performing a minimum value searching process to estimate said first minimum value of said first rectified voltage waveform.

11. The method as recited in claim 8, further comprising substantially eliminating high-frequency noise from said first rectified voltage waveform.

12. The method as recited in claim 8 further comprising determining a first unbiased reconstructed voltage waveform from said first rectified voltage waveform employing said estimate of said first minimum value and reversing a sign of negative samples of said first unbiased reconstructed voltage waveform to determine said first unbiased rectified voltage waveform.

13. The method as recited in claim 8 further comprising restructuring said first rectified voltage waveform into a first reconstructed voltage waveform.

14. The method as recited in claim 13 further comprising determining a first unbiased reconstructed voltage waveform from said first reconstructed voltage waveform employing a high pass filter and reversing a sign of negative samples of said first unbiased reconstructed voltage waveform to determine said first unbiased rectified voltage waveform.

15. A power converter, comprising:
a power train including power conversion circuitry configured to receive a rectified sensed voltage corresponding to an input voltage of said power converter and a rectified current sense voltage corresponding to an input current of said power converter;
a controller, comprising:
an analog/digital converter configured to provide samples of a first rectified voltage waveform corresponding to said rectified sensed voltage and a second rectified voltage waveform corresponding to said rectified current sense voltage; and
a processor configured to
estimate a first minimum value of said first rectified voltage waveform and a second minimum value of said second rectified voltage waveform in accordance with said samples;
remove a first offset from said first rectified voltage waveform and a second offset from said second rectified voltage waveform to obtain a first unbiased rectified voltage waveform in accordance with said estimate of said first minimum value and a second unbiased rectified voltage waveform in accordance with said estimate of said second minimum value;
apply a scaling factor to said second unbiased rectified voltage waveform to determine an unbiased rectified current waveform;
multiply said first unbiased rectified voltage waveform and said unbiased rectified current waveform to determine an instantaneous power; and
provide an average of said instantaneous power to determine an average input power of said power converter.

16. The power converter as recited in claim 15 wherein said processor of said controller is configured to estimate said first minimum value of said first rectified voltage waveform by employing a linear interpolation of said samples.

17. The power converter as recited in claim 15, wherein said processor of said controller is configured to perform a minimum value searching process to estimate said first minimum value of said first rectified voltage waveform.

18. The power converter as recited in claim 15 wherein said controller further comprises a filter configured to substantially eliminate high-frequency noise from said first rectified voltage waveform.

19. The power converter as recited in claim 15 wherein said processor of said controller is configured to determine a first unbiased reconstructed voltage waveform from said first rectified voltage waveform employing said estimate of said first minimum value and determine said first unbiased rectified voltage waveform by reversing a sign of negative samples of said first unbiased reconstructed voltage waveform.

20. The power converter as recited in claim 15 wherein said processor of said controller is configured to restructure said first rectified voltage waveform into a first reconstructed voltage waveform, determine a first unbiased reconstructed voltage waveform from said first reconstructed voltage waveform employing a high pass filter and determine said first unbiased rectified voltage waveform by reversing a sign of negative samples of said first unbiased reconstructed voltage waveform.

\* \* \* \* \*